United States Patent [19]

Barron et al.

[11] 4,128,201

[45] Dec. 5, 1978

[54] SYNCHRONIZING MEANS

[75] Inventors: Iann M. Barron, Redbourne; David J. Wheeler, Cambridge, both of England

[73] Assignee: Computer Technology Limited, London, England

[21] Appl. No.: 725,298

[22] Filed: Sep. 21, 1976

[30] Foreign Application Priority Data

Nov. 5, 1975 [GB] United Kingdom ............... 45908/75

[51] Int. Cl.$^2$ ............................................. G06F 11/00
[52] U.S. Cl. ............................... 235/304; 235/302.2; 307/232; 328/63
[58] Field of Search ............... 340/146.1 R, 146.1 AB; 307/232, 208; 328/63, 72, 109; 329/104; 235/302.2, 301, 304

[56] References Cited

U.S. PATENT DOCUMENTS

| | | | |
|---|---|---|---|
| 3,602,828 | 8/1971 | Kurzwell et al. | 329/104 |
| 3,942,124 | 3/1976 | Tarczy-Hornoch | 328/63 |
| 3,953,744 | 4/1976 | Kawagoe | 307/208 |

*Primary Examiner*—Charles E. Atkinson
*Attorney, Agent, or Firm*—Naylor, Neal & Uilkema

[57] ABSTRACT

Synchronizing means is provided for synchronizing with a periodically repeating reference signal the change of level of an input signal which is capable of assuming either one of a first and second level. A bistable device is enabled periodically by the reference signal to respond to the input signal and assume either one of its two stable states in correspondence with the first or second level of input signal and produce an output signal which has either one of two different levels according to the stable state assumed. Means is provided to respond to the output signal when it has a value intermediate the two levels to generate a stop signal which indicates that the bistable device is in a metastable condition and which is used to interrupt the reference signal at a predetermined point in its periodicity before the bistable device is next enabled and until the bistable device assumes a stable condition.

4 Claims, 19 Drawing Figures

SYNCHRONIZING MEANS

FIELD OF THE INVENTION

This invention relates to improvements in synchronising means and is particularly concerned with synchronising means for use in computer systems.

In computer systems many functions take place in timed relationship under the control of a periodically repeating reference signal which is usually a train of clock pulses. These pulses act as gates or timed windows during which various functions including information transfer between logic units take place. The pulses are also used to initiate operations. Computer systems also include units which within themselves are processing information but not necessarily in synchronism with the main clock pulse train so that such processed information becomes available to other parts of the system at times which are not necessarily synchronised with such other parts of the system.

The trent is to speed up the operation of a computer system so that more information processing steps can be performed in a given time. This means increasing the repetition frequency of the pulse train and hence reducing the processing time available per clock pulse.

In a digital system where a signal has one of two levels which may be represented by a (0) or a (1) and a part of the system has to take a decision in response to the signal level, it is necessary for that part of the system to identify the signal level and for the decision to be determined within the next clock period following that in which the signal is sampled and before the signal is again sampled. It is therefore necessary for the system to recognise the occasion when the signal is indeterminate by virtue of being sampled at a time when the signal level is changing and to delay the next clock pulse until the signal has stablised.

In order to maximise the available processing time per clock pulse, it is possible to sample the signal using gating means enabled by the leading edge of a clock pulse and having a built in small but finite dwell period during which it remains enabled. This leaves most of the period between leading edges of successive clock pulses available for the decision taking process referred to above and materially reduces the possibility of the gate means being enabled at a time when the signal is changing level. On the other hand, the short dwell period has the disadvantage that there is a finite possibility that the short time during which the gate means is enabled coincides with a period throughout which the level of the signal is changing and the sample reflects an intermediate value of the signal which does not identify in which direction the signal is changing. This can lead to the decision taken being incorrect and it is highly desirable that the system should pause until a correct decision can be taken when the signal level has stabilised. It is however also desirable that the system should not pause until the end of the clock period during which the signal level is being identified as other operations taking place during this clock period could be lost.

In co-pending application No. 725,307 of even date herewith there is disclosed an information transfer device for use in a computer system and an improved computer system embodying such information transfer device. The information transfer device comprises a motherboard into which fixed master logic units (masters) and fixed slave logic units (slaves) can be plugged and which control the transfer of information or data through the motherboard between a master and a slave or between a slave or a master. The masters and slaves are backed by dependent logic circuits and the system has the capability of detecting whether an addressed slave is busy and also whether a master addressing a slave has a higher priority than any other master addressing a slave. Information or data is transferred from a master to a slave through the motherboard during the period occupied by a clock pulse. There can only be one transfer of information through the motherboard during a clock pulse, this being from the highest priority master but the remaining units are busy performing their allotted tasks during this period. The system can operate at a clock pulse repetition frequency of 25 nano-seconds, and for this reason the motherboard may be termed a gigabus. A transfer request signal requesting the transfer of information across the motherboard is generated in dependent logic circuits and supplied to a master to initiate such a transfer. The transfer request signal is not necessarily in synchronism with the clock pulses and is a signal which can have either one of two levels represented by (0) or (1). The transfer request signal is sampled periodically in synchronism with the clock pulses to ascertain its value and to bring it into synchronism with the clock. The sample may however be taken during an interval of time during which the transfer request signal is changing so that it is viewed as being neither a (0) or (1) but some intermediate value. The master is then undecided as to the instruction and this must be determined before the next clock period. The clock is interrupted when the information transfer which may have been taking place during this clock period across the motherboard has been completed. The clock is then allowed to resume once the sample of transfer request signal has settled to a determinate (0) or (1).

SUMMARY OF THE INVENTION

It is an object of the present invention to provide a synchronising means for synchronising, with a periodically repeating reference signal, the change of level of an input signal capable of assuming either one of a first and second level which synchronising means shall be capable of identifying and responding to a level of input signal intermediate said first and second levels to interrupt the reference signal at a predetermined point in its period city.

According to the present invention there is provided synchronising means for synchronising with a periodically repeating reference signal the change of level of an input signal capable of assuming either one of a first and second level comprising a bistable device capable of assuming a first stable state in response to the first level of input signal and of assuming a second stable state in response to the second level of input signal and enabled periodically by said reference signal to respond to the level of the input signal and means responsive to any unstable condition of said bistable device, resulting from a level of input signal intermediate said first and second levels during the period the bistable device is enabled to respond, to generate an output signal operable to interrupt the reference signal at a predetermined point in its periodicity and before the bistable device is next enabled, until the bistable device assumes a stable condition.

Preferably, the bistable device has two outputs each capable of assuming two levels identified as (0) and (1) depending on the stable condition of the bistable so that the two outputs respectively assume levels (0) and (1) for one stable condition and (1) and (0) for the other stable condition and each assumes an intermediate level between (0) and (1) when the bistable device is in a metastable condition. The bistable device must be designed so that its outputs do not oscillate in its metastable region, and the means responsive to the metastable condition comprises comparison means operable to compare the levels of said two outputs and generate a stop signal when the difference between the levels of said two output signals is less than a predetermined value which is less than the difference between said (0) and (1) levels.

Advantageously, the stop signal is operative to interrupt the reference signal through a gate means which is enabled by the reference signal at said predetermined plint in its periodicity.

One embodiment of the invention will now be described by way of example, reference being made to the accompanying drawings in which:

DETAILED DESCRIPTION OF EMBODIMENTS

In the example illustrated in FIGS. 1 to 4, there is provided an information transfer device in the form of a mother board 1 which comprises a printed-circuit backplane into which a number of logic devices can be plugged. This mother board 1 is capable of a transfer data rate in excess of $10^9$ bits per second (one gigabaud) when implemented in fast Emitter-Coupled Logic (MECL 10K) with a transfer data word width of greater than 24 bits. The mother board may be referred to as a Gigabus.

Figure 1:
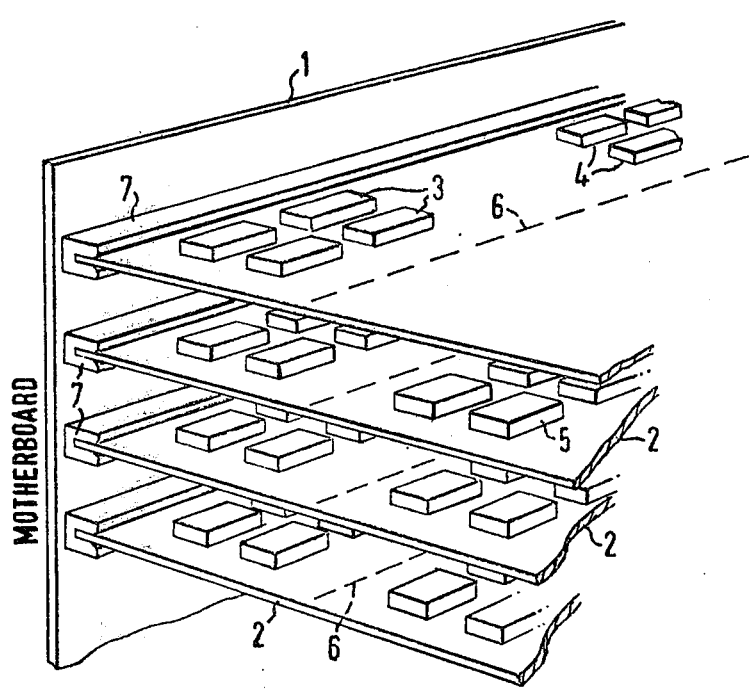
FIG. 1 is a fragmentary perspective view of a mechanical configuration of part of a computer system embodying an information transfer device.

The mother board of this example is intended to accommodate and serve eight master fixed logic devices (masters) and eight slave fixed logic devices (slaves), each logic device being backed by its own dependent logic circuits. Such logic devices and their dependent logic circuits are each mounted on daughter boards intended to be plugged into the mother board 1. Although the masters and the slaves can be physically separate and different in number from each other, in this example each daughter board 2 carries both a master 3 and a slave 4 together with dependent logic circuits located at 5 from which the masters and slaves are buffered by an interface represented diagrammatically by the dotted line 6. Only four of the eight daugher boards 2 are shown in FIG. 1 and it will be appreciated that each daughter board 2 is capable of operating as a master and a slave.

The mother board 1 is formed with a number of sockets 7 corresponding to the number of logic devices it is capable of handling. These sockets 7 which are shown as u-shaped to receive the edges of the daughter boards 2 house a set of mother board inlet/outlet terminals for each master and a set of inlet/outlet terminals for each slave. The daughter boards at their edges carry corresponding inlet/outlet terminals for the master and the slave which connect to the appropriate mother board terminals when plugged into a socket 7. Replacement of master and slave fixed logic devices is therefor easily effected and additional blocks of mother boards and daughter boards can readily be built into the computer system.

Figure 2:
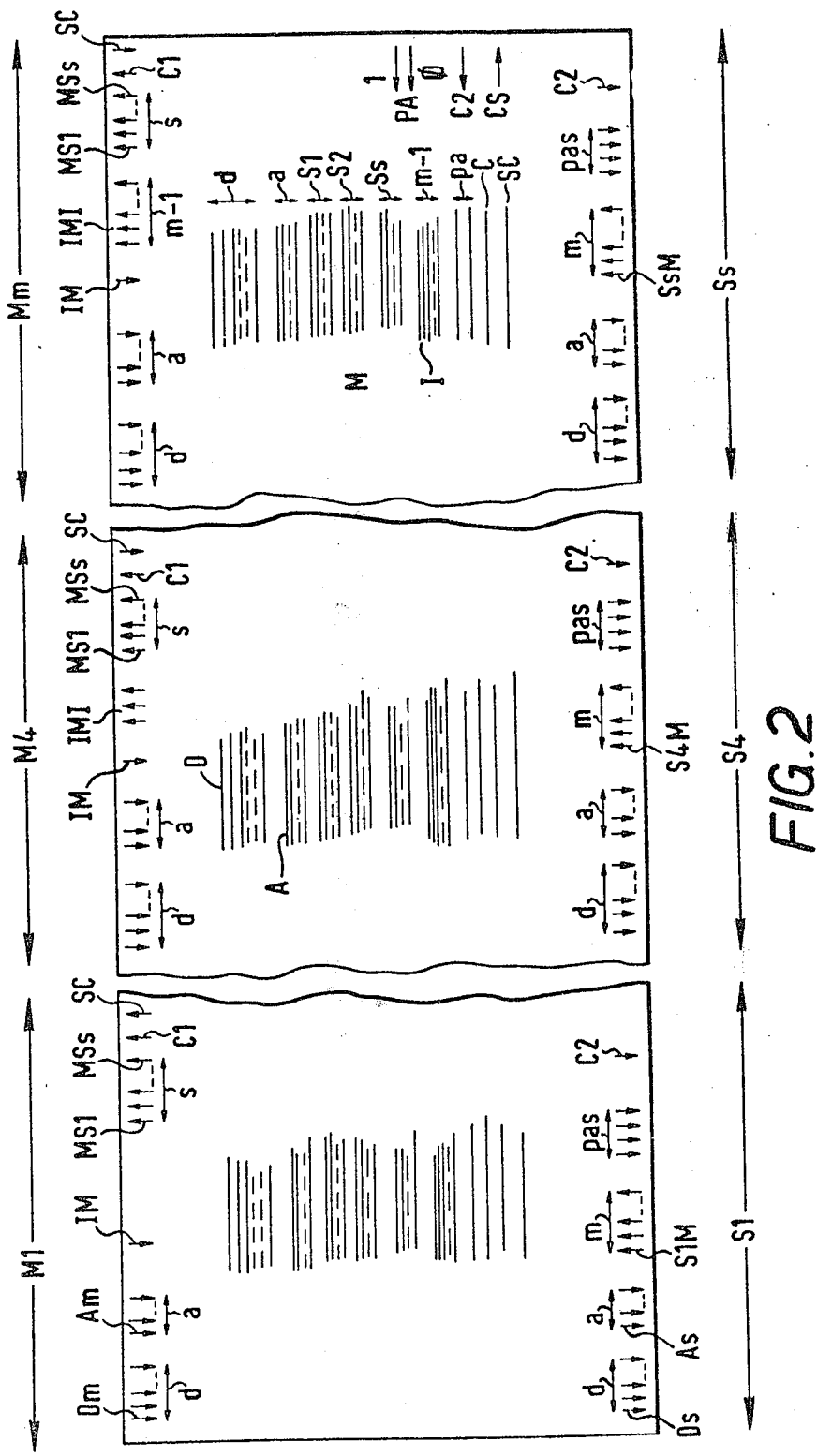
FIG. 2 is a diagrammatic representation illustrative of the conductive paths and input/output terminals provided on the transfer device of FIG. 1.

FIG. 2 shows the conducting paths and input/output terminals on the motherboard. It will be appreciated that this is only a diagrammatic representation and the master and slave terminals are shown at opposite edges of the board for convenience of illustration only. In practice, they would be provided in the sockets 7 for each daughter board. The input/output terminals can take any appropriate form to ensure electric contact with the terminals on the daughter board.

The mother board 1 is a printed circuit backplane which may be of sandwich construction and which carries conducting paths including power supplies. Of these conducting paths, d conducting paths D (FIG. 2) are required to carry the data word and a conducting paths A are required to carry the slave address signal, d being the maximum number of bits in a data word capable of being transferred through the mother board and a being the maximum number of bits capable of being used to identify a slave address. In this example, d is 40 and a is 4. Of the 40 bits in a data word, 32 are intended as the data field, 5 are intended as the command field identifying what the slave is to do with the information in the data field and 3 are intended to identify the master address from which the transfer originated. Each of the d conducting paths D is connected to a separate mother board input terminal D$m$ in each socket 7 for a master and to a separate motherboard output terminal D$s$ in each socket 7 for a slave. In other words, the d conducting paths D provide a data highway through which each master can communicate with each slave device. Similarly, each of the a conducting paths A is connected to a separate mother board input terminal A$m$ in each socket 7 for each master and to a separate mother board output terminal A$s$ for each slave so that a slave address signal originated from any master is transmitted to each slave.

Additionally there are $s$ groups (S1–S$s$) of $m$ conducting paths M where $s$ represents the maximum number of slaves which can be plugged into the mother board 1 and $m$ represents the maximum number of masters that can be plugged into the mother board. Each group (S1–S$s$) of $m$ conducting paths M connects to a mother board input terminal in a separate socket 7 for a slave and each of the m conducting paths in a group connects a separate mother board output terminal at each socket 7 for a master. Thus, the group of m conducting paths M associated with the first slave S1 will be separately connected with the m slave input terminals S1M and will be separately connected one to each master output terminal MS1 to MSs. The group of m conducting paths M associated with second slave S2 will be separately connected with the m slave input terminals S2M and will be separtely connected one to each master output terminal M1 to MSs and so on. The s groups of m conducting paths M are busy status lines as will be hereinafter described whereby a separate group (S1-Ss) of m conducting paths fan out from each slave socket or input terminal S1M to SsM to each master so that ech slave can inform each master of its busy or free status.

The mother board 1 has also a clock conducting path c which connects with a mother board output terminal C1 at each socket 7 for a master and a slave and also to a mother board input terminal C2 connectable to a source of clock pulses for synchronising the operation of the system. Such a source can in fact be provided on an additional daughter board which plugs into the mother board. k The mother board 1 may be provided with additional conducting paths depending upon the system in which it is employed and as will be apparent hereafter. In this example, two of the paths pa at different voltage levels and connected to input terminals PA are selectively connected to a number of mother board output terminals pas at each slave socket 7, which terminals are identified as the mother board slave address port output terminals for each slave. Thus if the lower of the two voltages represeents digit 0 and the higher voltage represents digit 1 it will be appreciated that each slave address port can by these terminals be uniquely coded and identified and when a slave is plugged into its socket 7 it acquires a unique address in the system. In this example there are four address port terminals at each socket 7 for a slave.

Figure 3:
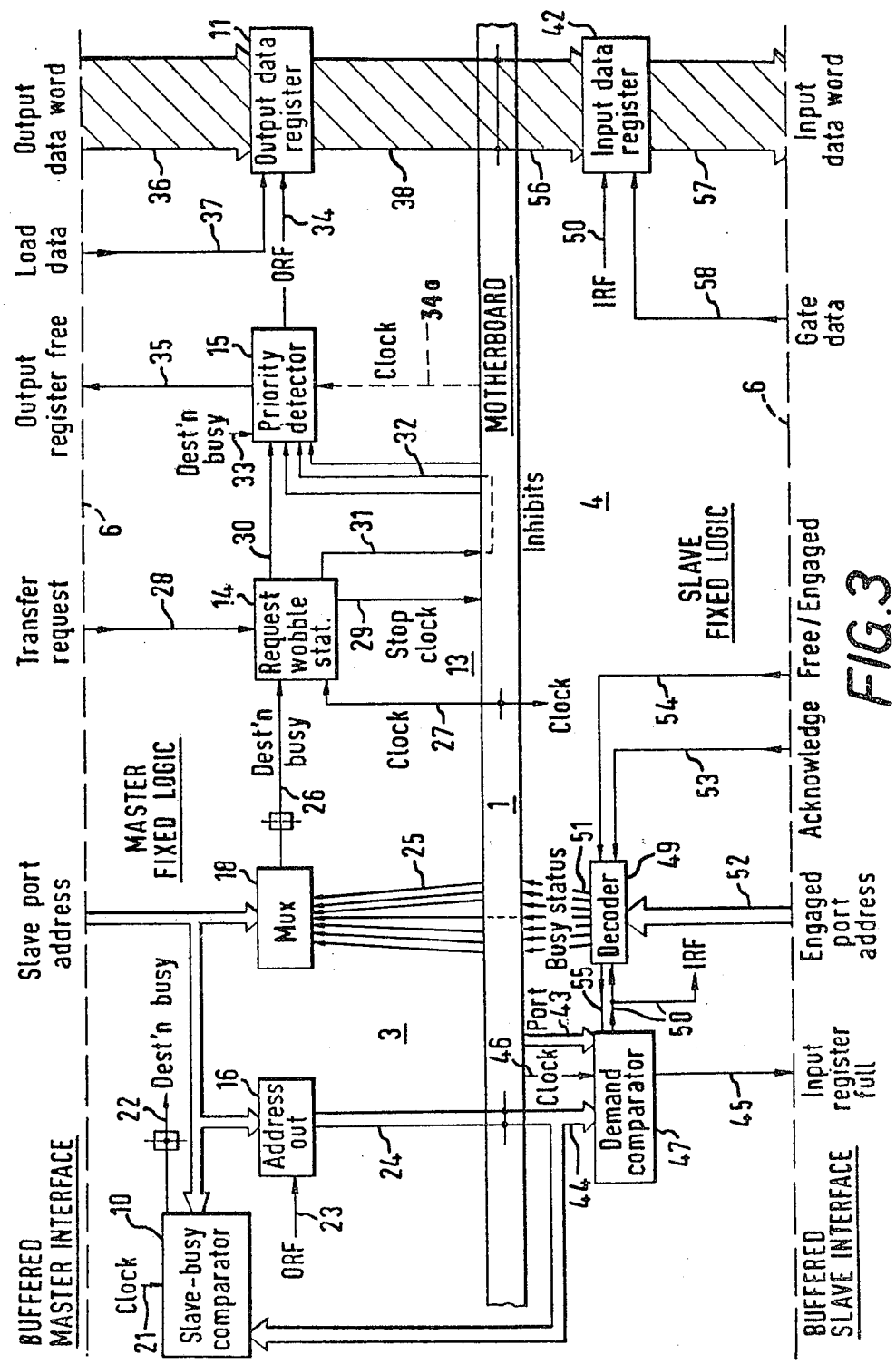
FIG. 3 is a fixed logic block diagram illustrating part of the computer system and transfer device of FIG. 1, and incorporating synchronising means according to the present invention.

In the part of the computer system exemplified in the block diagram of FIG. 3 one master 3 is shown to one side of the mother board 1 and one slave 4 is shown on the other side of the mother board 1 although in practice they are both located on the same side. The buffered interface to the respective device dependent circuits is shown by the dotted line 6 in each case.

The signals provided from the device dependent logic to the master 3 at the buffered interface 6 are as follows:

SLAVE PORT ADDRESS — The binary address of the slave to be used
OUTPUT DATA WORD — The binary data word to be transferred to the slave
LOAD DATA — The instruction for loading the OUTPUT DATA WORD into the master
TRANSFER REQUEST — The instruction to initiate transfer of the data word from the master to the slave The master also provides an output signal to the buffered interface 6 as follows:

OUTPUT REGISTER FREE (ORF) — Indicating that no transfer is in progress

The signals provided from the device dependent logic to the slave 4 at the buffered interface 6 are as follows:

ACKNOWLEDGE — Control strobe allowing the slave to accept another transfer
FREE ENGAGED — Control line used to enable the slave to accept transfers from any of the masters or from only one
ENGAGED ADDRESS — Binary address of single master controlled by both ACKNOWLEDGE and FREE/ENGAGED
GATE DATA — Enabling the data word transferred from the master to be gated to device dependent logic circuits.

The output signals provided from the slave 4 to the device dependent logic at the interface 6 are as follows:

INPUT DATA WORD — The binary data word received from the master
INPUT REGISTER FULL (IRF) — Control line indicating slave is busy and the INPUT DATS WORD is valid.

The master 3 comprises a slave-busy comparator 10, an address out unit 16, a multiplexor 18, a requires wobble stat 14, a priority detector 15 and an output data register 11. The SLAVE PORT ADDRESS signal at the interface 6 is supplied to the comparator 1C, the address out unit 16 and the multiplexor 18. The comparator 10 is also connected to the a conducting paths on the mother board 1 and under the control of clock pulses along line 21 stores each slave address transmitted along the mother board a conducting paths until the mext clock pulse period as will be explained more fully in relation to FIG. 12 below. When the master 3 receives a slave port address signal through the interface 6, the comparator compares this with the previous slave address sent along the mother board 1 and, if the addresses are the same, sends out a destination busy (DB) signal along output line 22. This means that the master 3 can immediately know that the addressed slave 4 is busy without having to check with the slave itself. At the same time, the address out unit 16 receives the slave address signal and, on receipt of an ORF signal along line 23 it passes the slave address to the a conducting paths on the mother board 1 along lines 24. The multiplexor (MUX) 18 is connected to one busy status line of each of s groups of m conducting paths on the mother board 1 along lines 25 and if any one of these indicates the addressed slave 4 to be busy it generates a DB signal at output line 26 as will be explained below with reference to FIG. 10. The output line 26 is connected to a request wobble stat 14 which will be described below in greater detail with reference to FIG. 5 but which receives an input along line 27 from the clock conducting path and also a transfer requrest signal along line 28 from the interface 6 to initiate a transfer from master to slave. As the device dependent logic feeding the master 4 through the interface 6 is not required to operate synchronously with the mother board clock pulses, it is necessary to synchronise the transfer request signal along line 28 with the clock. The requres wobble stat 14 is an edge triggered device and there is a finite possibility of the transfer request signal and a clock pulse changing simultaneously causing the output from the request wobble stat 14 to become undefined for a certain period of time. As is described below, detection of this wobble state is achieved by a differential line receiver which operates to compare the true and inverse outputs of the request wobble stat 14. When both outputs are the same, the request wobble stat 14 provides a stop clock signal along line 29 through motherboard input terminal SC to a conducting path sc on the mother board which operates through output terminal CS to inhibit further operation of the connected clock source until the request wobble stat 14 has settled to a defined state. When this occurs, and the input along line 26 also indicates that the destination is free, the request wobble stat produces an output signal to the priority detector along line 30 and further provides an inhibit signal along line 31 to an output terminal connected to a mother board inhibit input terminal. The mother board 1 carries m−1 inhibit conducting paths I and the sockets 7 for the masters 4 are arranged in order to precedence or priority. The mother board inhibit input terminal IM at the highest priority master socket 7 is connected to all m−1 inhibit conducting paths which are connected to separate mother board inhibit output terminals IMI, one at each master board socket 7 so that an inhibit signal from the highest priority master 4 along line 31 is transmitted to each lower priority master. None of the m−1 inhibit conducting paths I is connected to a mother board output terminal IMI for the highest priority master socket 7 so that the highest priority master cannot be inhibited by any lesser priority master. In the same way, each master socket 7 has a mother board input terminals IM connected by the inhibit conducting lines I to a mother board output terminal IMI at a master socket 7 for each lower priority master and has a mother board output terminal IM connected by the inhibit conducting lines I to a mother board input terminal IM at a master socket 7 for each higher priority 7. Thus, although each master 3 may be identical with the others, its priority in the system is determined by the socket 7 into which it is plugged.

As shown in FIG. 2, the motherboard has a priority input terminal IM for each master although that for the lowest master Mm would be redundant as it has no priority. The motherboard is not shown with an inhibit output terminal IMI at the highest priority master position for M1 as this master M1 cannot be inhibited by any lower priority masters. The motherboard at the position for master M4 is shown with three output terminals IMI as master M4 can be inhibited by higher priority masters M1, M2 and M3. The motherboard at the position for the lowest priority master Mm has m−1 output terminals IMI as it can be inhibited by any of the other masters.

The priority detector 15 has m−1 inhibit input lines 32 connected to master inhibit input terminals at the edge of the daughter board but only in the case of the lowest priority master are these all activated by connection to corresponding active output terminals in the mother board socket and, in the case of the highest priority master, none are activated. The priority detector also receives a signal along line 33 identifying the busy or free status of the addressed slave, this line 33 being connected to DB lines 22 and 26. The priority detector also received the clock pulses 34a line 34a and provided it is not inhibited by an inhibit signal along line 32 indicating that a higher priority master requires to use the mother board, providing te addressed destination is free as indicated by the signal on line 33 and providing a transfer request on line 28 has been passed by the request wobble stat 14 on line 30, an ORF signal is generated during the next clock period and fed along line 34 to the output data register 11 to transmit the data stored therein and an ORF signal is also fed along line 35 to the interface 6 to indicate to the dependent logic that the transfer is in progress.

The output data register 11 received data from the dependent logic along highway 36 and accepts it for storage on receipt of a load data instructing signal along line 37. The register 11 releases the stored data to the d conducting lines on the mother board via highway 38 on receipt of the ORF signal on line 34.

Each slave 4 includes an input data register 42, a demand comparator 47, a decoder 49 and has a slave address port path 43 connecting the comparator 47 to the slave address port input terminals which connect with the mother board slave address port output terminals described above in order uniquely to define the slave address.

Figure 11:
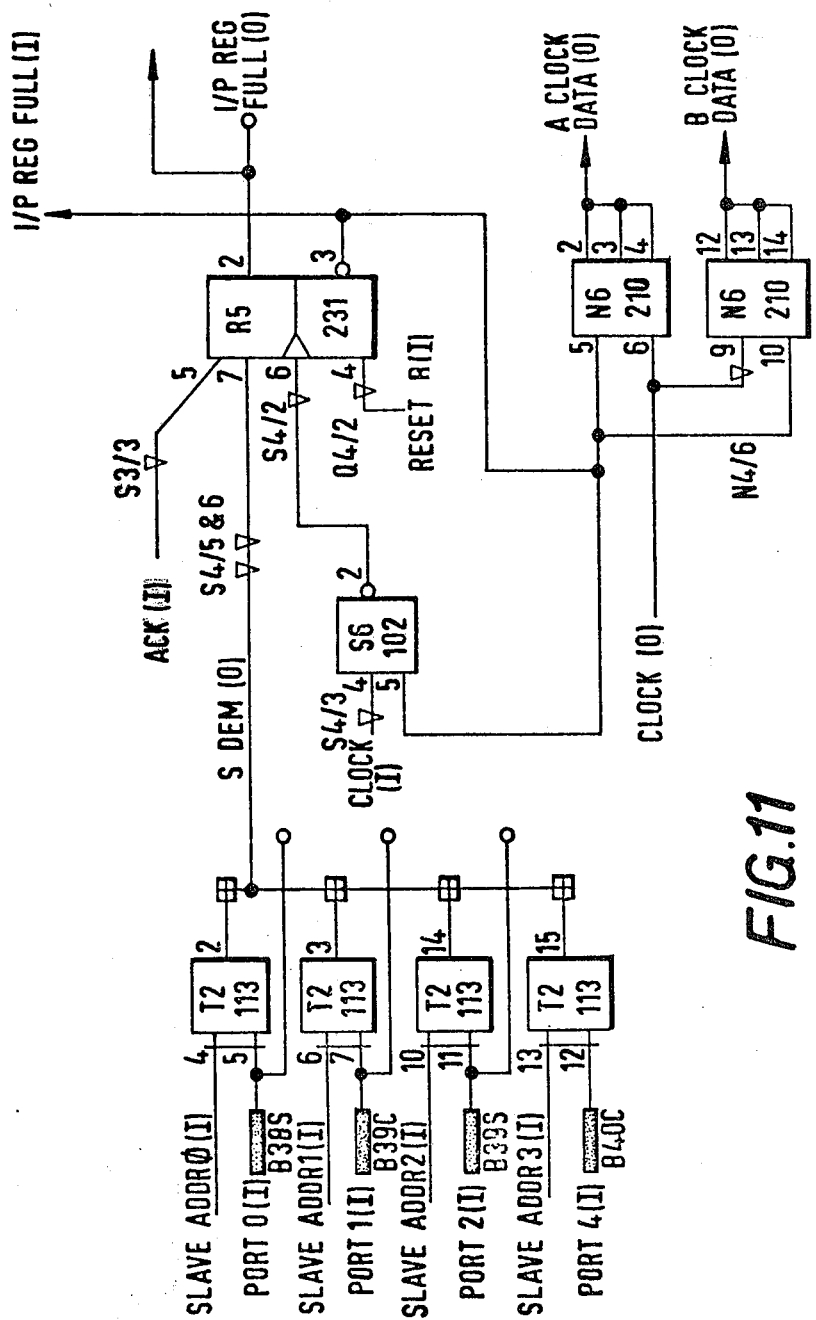

The demand comparator 47 is connected to the a conducting paths of the mother board 1 by address path 44 which in every clock cycle compares the address demanded with its own address and if there is coincidence sends out an IRF signal along line 45 to the slave interface 6. Clock pulses are supplied to the comparator 47 along line 46 connected to the clock conducting path on the mother board. An IRF output signal is also supplied along line 50 both to the decoder 49 and the input data register 42. The operation of the comparator 47 is described in greater detail below with reference to FIG. 11.

The decoder 49, has m outputs at 51 each connected to a separate one of the m conducting paths of one of the s groups so that it can indicate a busy status to all the masters. It does however have the facility as will be explained below with reference to FIG. 13 of indicating a busy status on all but one of these lines so that it appears busy to all masters except that master from which it is receiving information. This is controlled by the engaged port address signal which the decoder 49 received from the slave interface 6 along paths 52, an acknowledge signal which it receives along line 53 and a free/engaged signal which it receives along line 54. Thus, once the slave has been set busy by the transfer of a data word, it is able at any subsequent time to be set free or engaged by use of the acknowledge line 53 and the free/engaged line 54. Thus a signal along acknowledge line 53 and a "free" signal along free/engaged line 54 will cause the decoder 49 to reset the busy status lines 51 to "free" and produce an output along line 55 to the comparator 47 to reset the IRF signal along line 50 and allow the input data register 42 to be undefined. A signal along acknowledge line 53 and an "engaged" signal along free/engaged line 54 will cause the decoder 49 to reset only one of the busy status lines 51 to "free," this one being connected to the instructing master and being defined by the engaged port address signal along paths 52. The decoder will also, in this case, produce an output along line 55 so as to reset the IRF signal along line 50 and allow the input data register to be undefined.

Figure 16:
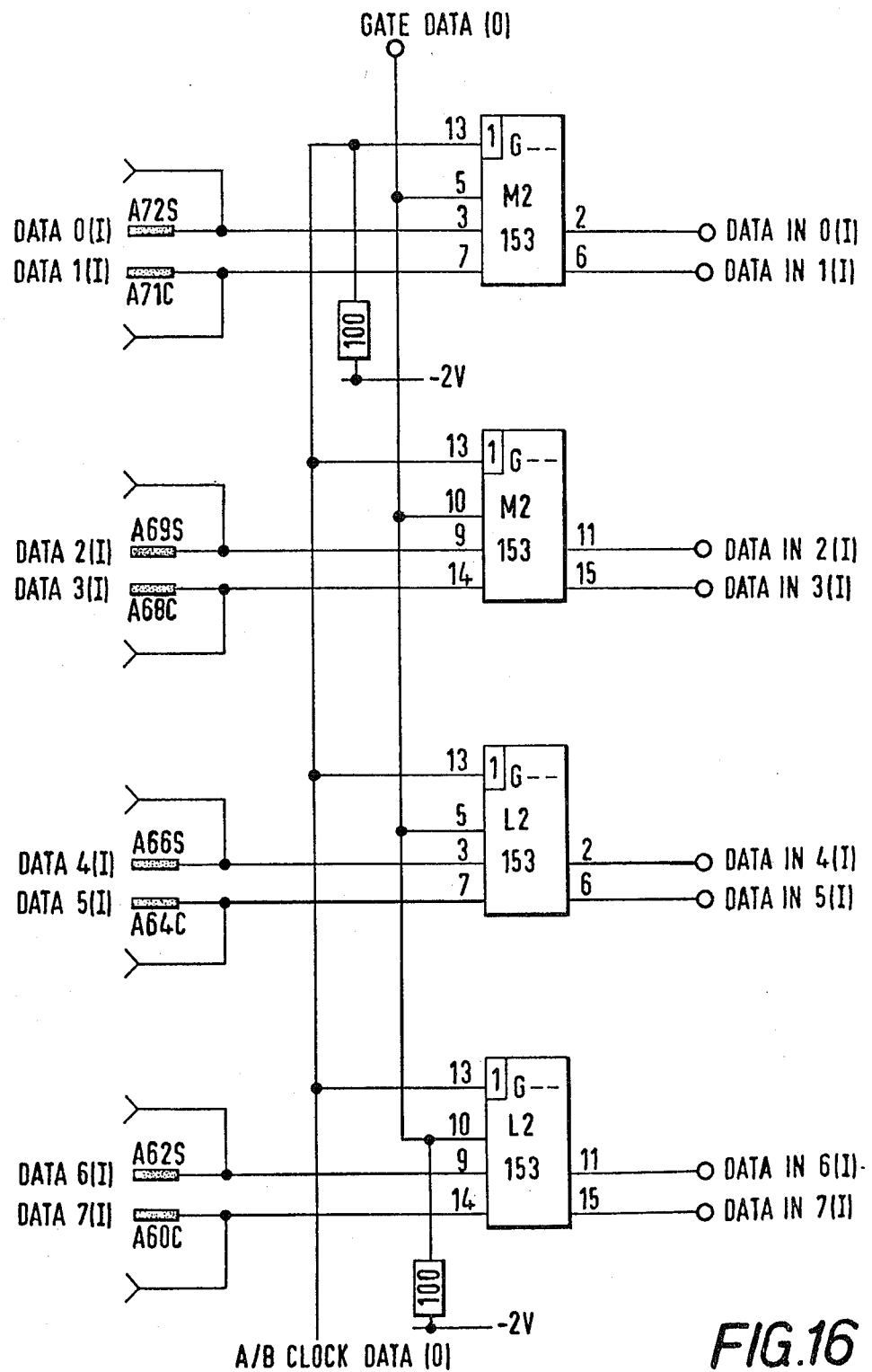

The input data register 42 is a data word store connected by highway 56 to the d conducting paths D on the mother board. When the slave is free, the input data register 42 receives and stores each data word appearing along the d conducting paths, each such data word erasing the previous word. When the input data register 42 receives an IRF (input register full) signal along line 50, it no longer will accept any subsequent data words and holds in the store the data word locked in by the IRF signal. This stored data word is released to the slave dependent logic along highway 57 on receipt of a "gate data" instruction along line 58. The input data register is described further below with reference to FIG. 16.

In the system thus far described, it will be appreciated that each transfer or communication from a master to a slave takes place through the highway provided by the mother board 1. Each master can communicate with each slave and the priority of each master is uniquely determined by the mother board as is also the slave port address of each slave. Furthermore, the mother board, through its s groups of m conducting paths M always carries the information as to the status of all the slaves to all the masters and an addressed slave can lock-on to an instructing master whilst appearing busy to all others. Data words are transferred during clock periods. Also, as described above, it is preferred that each daughter board 2 should carry both the master 3 and the slave 4 so that each daughter board can act as a master or a slave according to the requirements of the dependent logic.

The operation of the computer system thus far described is briefly as follows:

When the master dependent logic requires to initiate a transfer through a master 3 to a slave 4, the data word to be transferred is supplied to the output data register 11 along highway 36 and entered therein on receipt of a load data instruction along line 37. A transfer request signal appears on line 28 to the request wobble stat 14 and the binary address of the slave is fed to the slave-busy comparator 10, the address out unit 16 and the MUX 18. The comparator 10 checks the slave address with that of the slave addressed by any master in the immediately preceding clock cycle. If it detects coincidence a destination busy signal appears on line 22 and is fed on line 33 to the priority detector 15 to inhibit further operation. The slave address is checked in the MUX 18 against the busy status lines of all slaves. If the addressed slave indicates it is busy along one of the lines 25 the MUX 18 generates a busy status signal along line 26 which again is used to inhibit the priority detector 15. Assuming the addressed slave is free, the transfer request signal along line 28 produces an output from the request wobble stat along line 30 to the priority detector 15. It also produces an inhibit signal along line 31 which is supplied to all masters of lower priority. The priority detector 15 may be inhibited by an inhibit signal from a higher priority master in which case nothing happens. When not so inhibited, the detector 15 produces an ORF signal along line 34 releasing the data word along highway 38 to the d conducting paths on the mother board 1. The ORF signal is also supplied to the address out unit 16 along line 23 to release the slave address to the a conducting paths on the mother board. The addressed slave compares the address with its fixed port address, identifies it as its own address and produces and IRF signal which is supplied to the slave dependent logic along line 45, the decoder 49 along line 50 and to the input data register 42 which locks in the data word received in that clock cycle from the d conducting paths on the mother board. The slave dependent logic is alerted to the fact that the input data register is full by the IRF signal on line 45. The IRF signal on line 50 causes the decoder 49 to generate a busy signal to all masters on lines 51 with the possible exception of the instructing master as described above. The slave dependent logic acquires the data word by sending a gate data signal on line 58 which releases the data word from the register 42 along highway 57 to the slave dependent logic. The slave dependent logic acknowledges receipt of the data word by an acknowledge signal along line 53 and either a free or engaged signal along line 54, a free signal resulting in the slave 4 becoming free and available to any master and an engaged signal resulting in the slave 4 being busy to all masters except that identified by the engaged port address paths 52.

Figure 4:
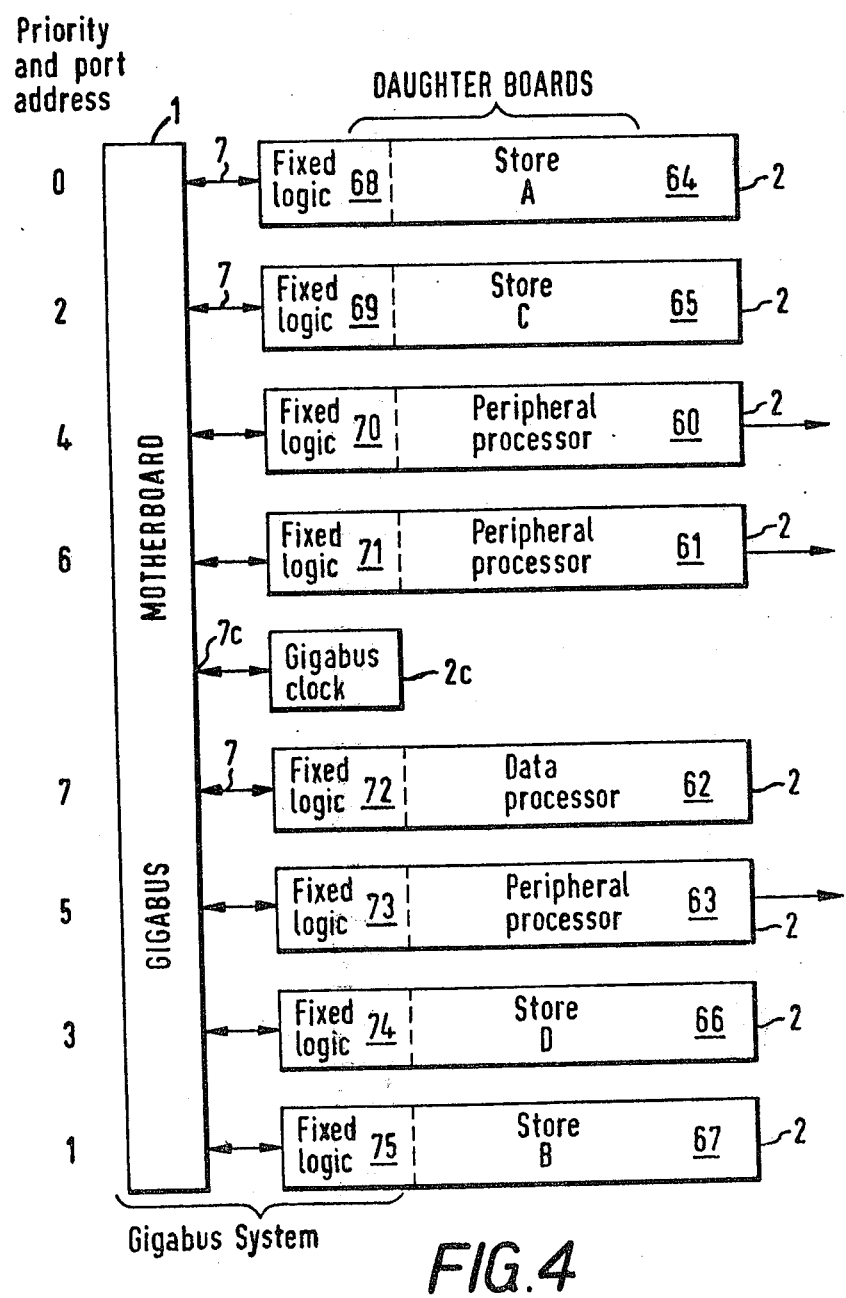
FIG. 4 is a block diagram illustrating the computer system and transfer device of FIG. 1.

The computer system exemplified in FIG. 4 comprises four independent processors 60–63 and four independent stores 64–67 each with its own master and slave fixed logic 68–75 on the daughter boards so that each can act as a master or a slave. There are therefor eight mother board sockets 7. The clock source is also mounted on a daughter board identified as ac and plugged into the mother board 1 at an additional socket 7c. The priority of each unit in the system is shown down the left-hand side of the mother board 1. Communication can take place between any of the units and an exchange of information between any two processor-store pairs usually requires at least two transfers on the mother board 1. Each data transfer contains sufficient information for each addressed slave to take appropriate action. The clock operates on a 25ns period and it is possible for any processor-store pair to exchange data effectively without interference from other such pairs since each transfer only occupies the mother board for 25ns, and this is almost insignificant compared to the store and processor set-up times. Where a chain of transfers occurs between a processor and a store, the engaged facility can be used to stop another processor accessing the same store in the middle of a chain.

It will be observed that the drawings contain various legends followed by (O) or (I), the legend identifying the signal which appears on the line associated therewith and the (O) or (I) representing that the signal can have a low level or a high level represented respectively by (O) or (I), the (O) or (I) following the legend identifying the level required for the legent 2cbe true. Thus, in the request wobble stat 14 shown in FIG. 5 the transfer request line 28 is associated with the legent REQUEST (O). This means that for a transfer request to be present or true, line 28 must be at the lower or (O) level. Similarly the destination busy line 26 is associated with the legent DEST BUSY (I). This means that for this condition to be true, i.e. the destination to be busy, line 28 must be sitting at the (I) or higher level.

Also, these figures show units as boxes identified by numbers and references such as T6, Q5. The numbers, when prefixed by 10, identify the unit which is an ECL unit. Thus the number 102 identifies an MECL unit (M identifying the manufacturer) 10102 and the reference T6 or Q5 or P6 identifying its physical location on the daughter board. Each such unit is shown associated with further numbers which are pin numbers for that particular unit. The small rectangles with numbers therein are resistors with the value shown in ohms. The black rectangles such as B43C, B46S are terminals at the edge of the daughter board for connection to the mother board.

In some figures, inverted triangles are shown intersecting electrically conducting lines. An example of this appears in FIG. 11 where two adjacent inverted triangles are identified as S/4 5 and 6. These inverted triangles each represent a 100 ohm resistor connected to a −2V. bias.

Figure 6:
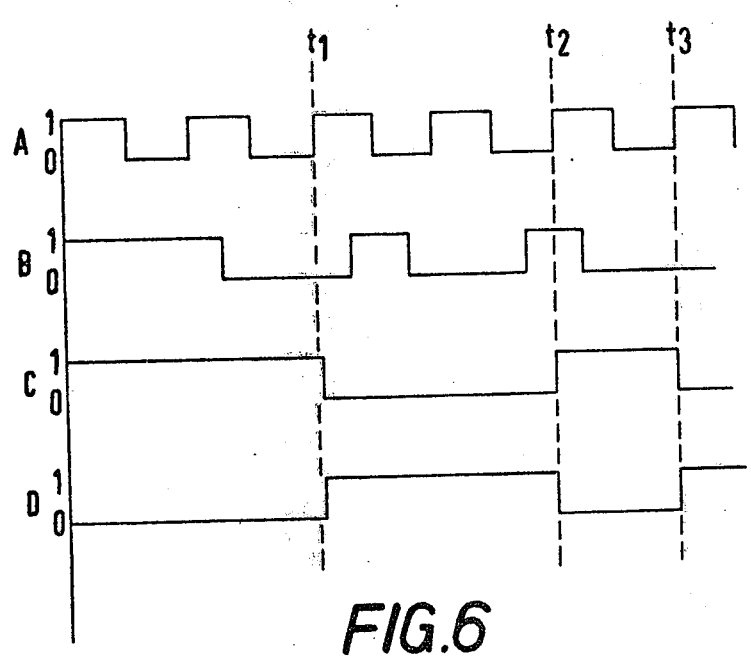
FIG. 6 is a diagram illustrating waveforms associated with the synchronising means of FIG. 5.

The request wobble stat 14 referred to above operates to synchronise the transfer request signal along line 28 with the clock. The clock pulse source is a free running source generating a pulse train with a 25ns period and a 1:1 mark to space ratio. The clock waveform is illustrated at A in FIG. 6 and is the signal appearing at pin 6 of unit Q5/231. Waveform B represents the signal level appearing at pin 7 of unit Q5/231 as a result of a transfer request signal alongline 28. Waveform C of FIG. 6 represents the resulting output at pin 2 of unit Q5/231 and waveform D represents the corresponding inverse waveform appearing at pin 3 of unit Q5/231. It can be seen that the leading edge of the clock pulses (considered as a change from level (0) to level (1) samples waveform B and, if a change in level of waveform B has occurred, produces a corresponding change in the level of waveform C and irs inverse waveform D. These changes are shown as taking place at times $T_1$, $t_2$, and $t_3$.

The 10231 is a clock triggered D type flip-flop which responds at its output pins to the data input on pin 7 only on the change at pin 6 from a zero to a one valve, a positive going edge. It does not respond in any way to the negative going edge at pin 6. It does of course respond to the set and re-set signal at pins 5 and independent of any timing. Each time the clock pulse changes from a zero value to a one value at pin 6 of Q5/231 then the stat, copies the data appearing at pin 7 on to pin 2 and its inverse to pin 3. In the quiescent state pin 7 in fact sits at a 1, so pin 2 is a 1 and pin 3 is a zero. So on 10116 MECL 10K receiver position AP6 the inhibit (O) line is not true sitting at a one. At B46S inhibit A out line sits at a (O) (Not true), inhibit B out line sits at a (O) (not true) and stop clock sits at a (I) (not true). This is the quiescent state of the circuit. In the free running state of the circuit : when the master device is ready to transfer a data word to a slave, the transfer request line 28 is set to (O) In order for that signal to be propogated through the MECL 10109, to pin 2 thereof, all three input signals there to should be (O), therefore destination busy must be not true and output register free (ORF) must be true. Once the request has been set true, at the next change if state of clock from zero to one at pin 6 of Q5 that request is set in Q5/231 at pin 7 and pin 2 goes to a (O) and pin 3 goes to (I). This then generates inhibit (O) true, inhibit A out true and inhibit B out true, and also generates permit true. Stop Clock does not change in the normal state of affiars. The only time that Stop Clock will change is where a request, or the output of 10109 at pin 2 changes at exactly the same time as the free running clock changes from a zero to one, so that the data on Q5 at pin 7 is changing in value when the clock is also changing from zero to one, and trying to copy the value at pin 7 on to pins 2 and 3.

In this situation, pin 7 is fed at a level intermediate between the normal logic levels, approximately −1.3V, sometimes referred to as "bias" because of the use of a similar level internally in ECL gates.

Figure 7:
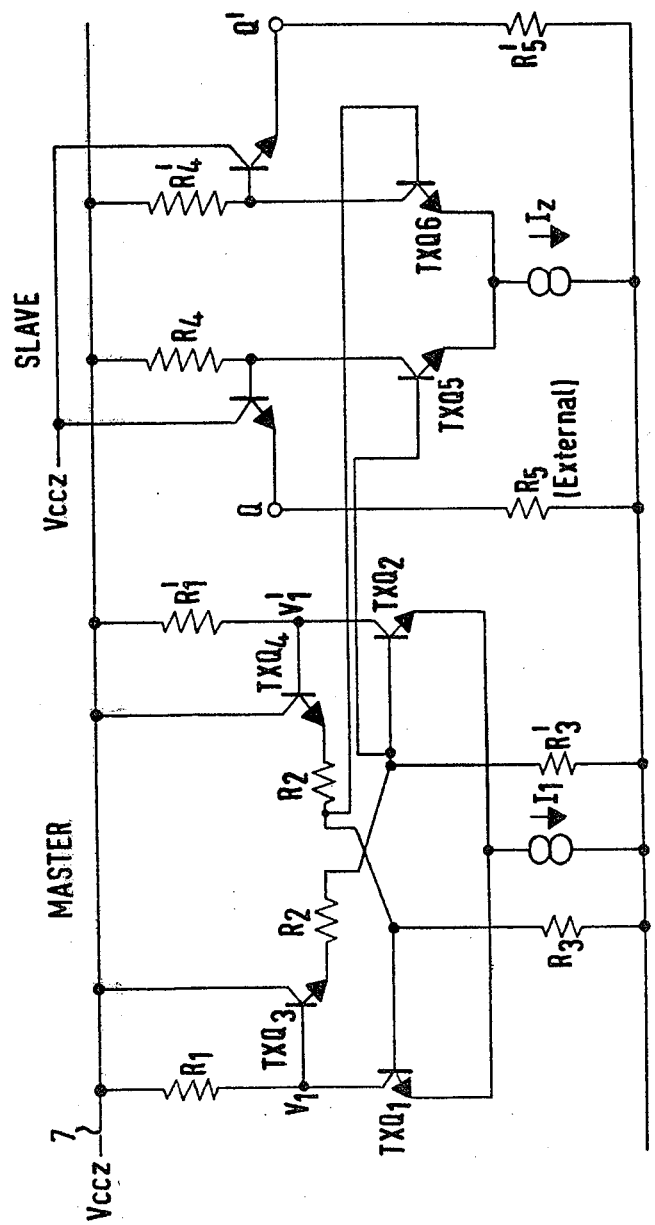
FIG. 7 is a circuit diagram illustrating a part of the synchronising means of FIG. 5.

Referring to FIG. 7, this causes the internal voltges $V_1$ & $V_1^1$ to be closely equal, and because of the symmetry of the circuit, transistors TXQ1 and TXQ2 share current I, closely. The voltages ($V_1$ and $V_1^1$) across $R_1$ and $R_1^1$, caused by half I, flowing through each, are thus closely equal. This bistable is then held in a meta-stable state with its internal voltage levels intermediate between the normal logic levels.

Transistors TXQ5 and TXQ6 have the same base voltages as TXQ1 and TXQ2 so the Q and $Q^1$ outputs are at bias at pins 2 and 3 of Q5.

Depending upon the timing relationship between the signal on pin 7 and the clock (FIGS. 5) there is a small impetus for $V_1$ and $V_1^1$ to differ, and positive feed back around the TXQ1 and TXQ2 bistable eventually forces the internal voltages to valid logic levels. The Q and $Q^1$ outputs then also go to valid logic levels. For situations where $V_1$ and $V_1^1$ were initially very closely equal, the final logic states are intermediate at the time the clock changes from "1" to "1."

Figure 5:
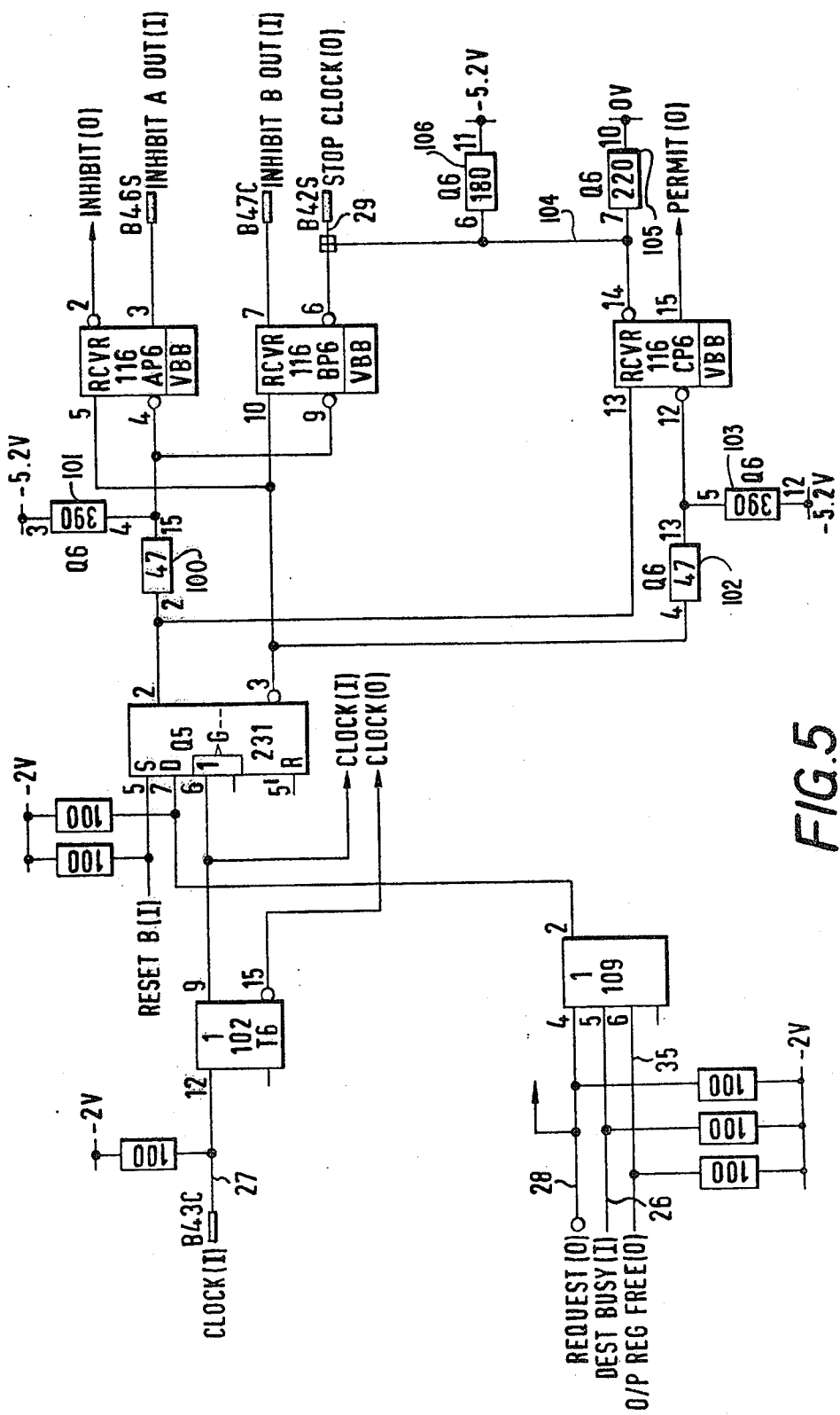
FIG. 5 is a block diagram illustrating in greater detail the synchronising means of FIG. 3.

While in the meta-stable state, both the Q and Q' outputs of Q5 at pins 2 and 3 in FIG. 5 will sit at bias.

Figure 8:
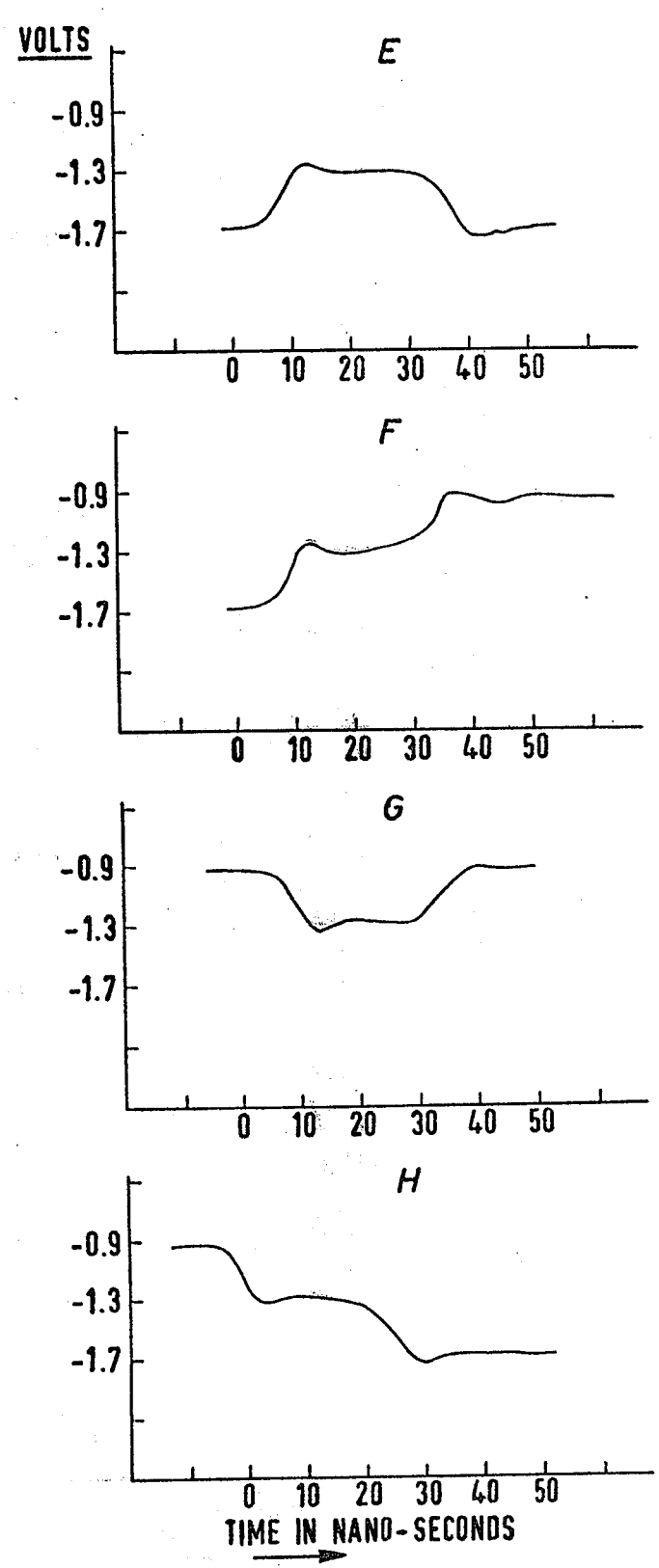
FIG. 8 is a further diagram illustrating waveforms associated with the synchronising means of FIGS. 5 and 7, FIGS. 9 to 18 are block diagrams illustrating in greater detail example of various units of the computer system illustrated in FIG. 3.

The design of the MECL 10231 is such that its outputs do not oscillate in the unstable region, but rather maintain a substantially steady bias level during the period of wobble. This is illustrated by wave forms E, F, G and H shown in FIG. 8, which are waveforms actually obtained with an MECL 10231, the scale of the ordinates being 0.4 volts per large square and the scale of the abscissa being 10n. seconds per large square. waveform E shows the bistable trying to switch from the (0) to the (1) condition and hovering in the quiescent or intermediate condition for a period of over 20 n. secs, before returning to the (0) condition. Waveform F shows the bistable switching from the (0) to the (1) condition but assuming the quiescent state or intermediate condition for a period of about 20 n. secs before actually deciding to switch to the (1) condition. Waveform G and H are similar to waveforms E and F but with the bistable swtiching or attempting to switch from the (1) to the (0) condition. These waveforms were obtained by artificially inducing the wobble state on the MECL 10231 (Q5) of FIG. 4 by using a variable delay to control the timing of the signal to pin 7 to simulate the condition described. It will be seen that the bistable assumed the quiescent state or intermediate condition for a time of the order of 20 nano seconds which is of the same order as the decribed pulse repetition frequency of 25 nano seconds and therefore far from negligible.

While in a quiescent state, both the outputs of Q5/231 at pins 2 and 3 will set at bias which is a level intermediate levels (0) and (1). Consequently the difference, if any, between the levels at pins 2 and 3 will be markedly less than the difference between the levels (0) and (1) normally present at these pins 2 and 3 (the level at one being normally the inverse of the level of the other). This condition is detected by a differential line receiver which includes units P6/116. Three such units are shown identified as AP6, BP6 and CPC. The output at pin 2 of Q5/231 is supplied through a 47 ohn resistor 100 to pin 4 of unit AP6 and to pin 9 of unit BP6 and is biased by a 390 phm resistor 101 connected to −5.2 volt supply. The resistors 100 and 101 together with the negative voltage supply provide a biasing network. The output of pin 3 Q5/231 which is the inverse of that at pin 2 is supplied to pin 5 of unit AP6 and pin 10 of unit BP6. when pin 2 of Q5/231 is at level (1), pin 3 is at level (0) and pin 2 of unit AP6 is at level (1); pin 3 of unit AP6 is at the inverse level (0), pin 6 of unit BP6 is at level (1) and pin 7 thereof is at level (0). These levels reverse when the level at pin 2 of Q5/231 reverse. Pin 2 of Q5/231 is connected to pin 13 of unit CP6 and pin 3 of Q5/231 is connected through a 47 ohm resistor 103 connected to −5.2 voltage source. When the level at pin 2 of Q5/231 is at (1) the level of the output at pin 14 of unit CP6 is at (0) and that of pin 15 is at (1) and these conditions reverse when the level at pin 2 of Q5/231 is reversed. Pin 14 of unit CP6 is connected to pin 6 of unit BP6 and to stop clock (0) terminal B42S through line 104 which is also connected to zero volts through resistor 105 and to −5.2 volts through resistor 106. It will be observed that under normal conditions pin 14 of unit CP6 is at an inverse level to that of pin 6 of unit BP6 so that terminal B42S will see a level (1) and stop clock (0) will not be true. It will also be observed that for unit BP6 it is the level of the signal at pin 2 of Q5/231 which is biased negatively whereas it is the level of pin 3 if Q5/231 which is biased negatively for unit CP6. When Q5/231 is in its quiescent state with the outputs at pins 2 and 3 in an undecided state and at levels (approximately the same) between (0) and (1) the nagative bias applied through resistors 100, 101 makes the signal appearing at pin 9 of unit BP6 appear more negative than that at pin 10 so that unit BP6 identifies a condition which appears to be pin 2 at level (0) with respect to pin 3 at level (1). This puts pin 6 at level (0). At the same time the bias provided by resistors 102, 103 makes the signal appearing at pin 12 of unit CP6 more negative than that appearing at pin 13 so that to unit CP6 the condition appears to be pin 2 at level (1) and pin 3 at level (0). This produces an output at level (0) at pin 14. The bias provided through resistors 100, 101, 102 and 103 therefor has the effect of unit BP6 identifying the inverse condition to unit CP6 with the result that pins 6 and 14 of units BP6 and CP6 both sit at level (0) which identifies the stop clock condition as being true and this has the effect of stopping the clock as will be described. It will be appreciated that the bias applied through resistors 100, 101, 102 and 103 must be less than the difference between levels (0) and (1) at pins 2 and 3 so as not to be effective during normal operation but must be greater than the differnce between the levels at pins 2 and 3 in the intermediate or quiescent condition. A typical value for level (1) would be −0.9 volts and for level (0) would be −1/7 volts. The intermediate level would be about −1.3 volts.

Referring to FIG. 5, we now have reached a state where the clock will be stopped at a not true value of zero, thus inhibiting the strobing of the wobble stat 10231 Q5 pin 6 unitl that stat has settled into a proper condition of either a zero or a one, at both pins 2 and 3. Once that condition has settled the STOP CLOCK signal is removed and the clock is allowed to continue and change its state in a free running style again. Thus, one again, clocking the value at pin 7 on to pin 2, this time correcting the incorrect value that may have previously been set.

The transfer request signal must remain true until the signal output register free provides an indication that the transfer has been completed.

The 10231 is a clock triggered D type flip-flop which responds at its output pins to the data input on pin 7 only on the change at pin 6 from a zero to a one value, a positive going edge. It does not respond in any way to the negative going edge at pin 6. It does of course respond to the set and re-set signals at pins 5 and 5', independent of any timing.

Figure 9:
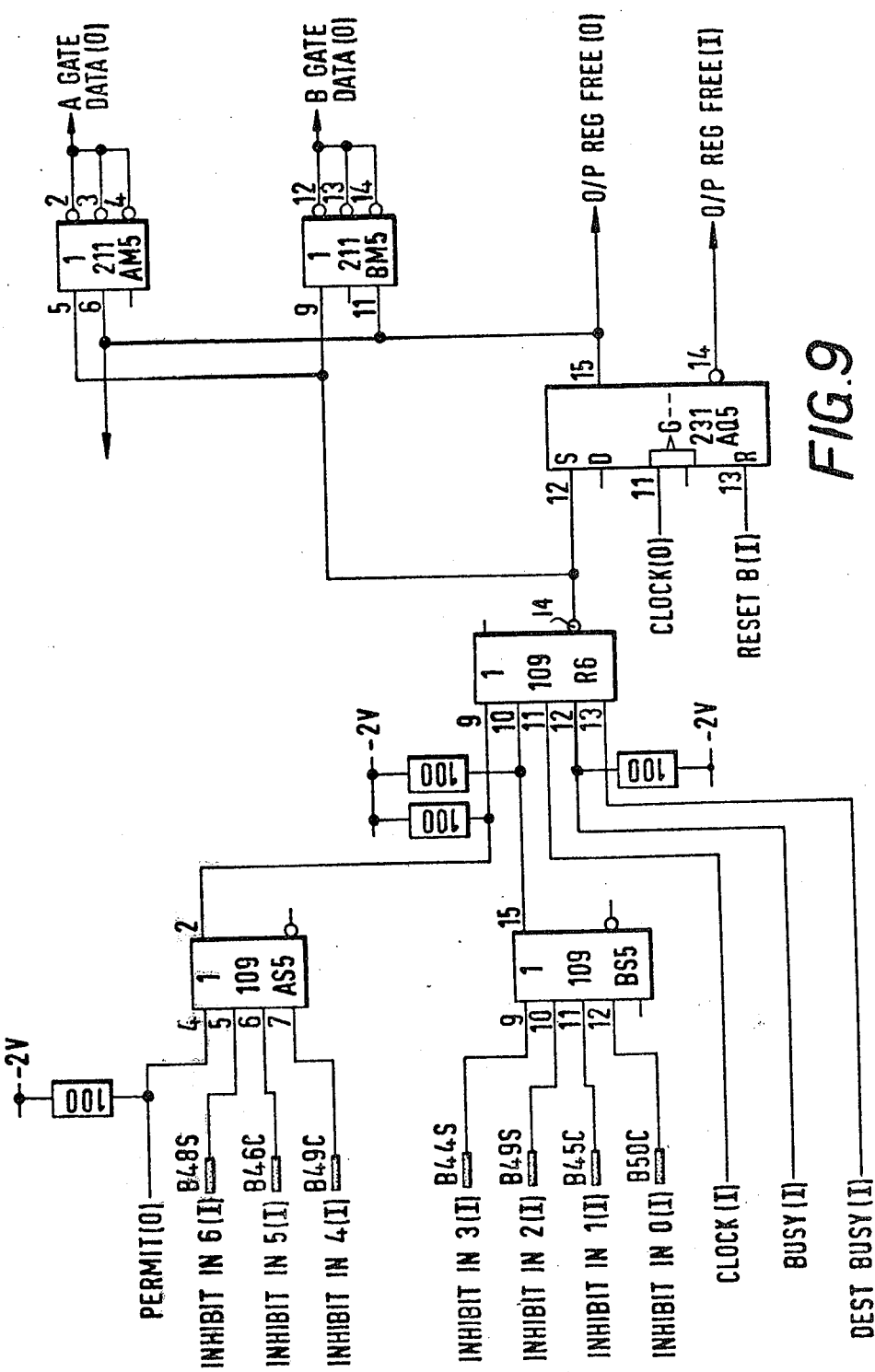

When the request wobble stat Q5 pin 2 is set with the transfer request, signal permit is true, generated on FIG. 5 at pin 15 of 10116/CP6. This signal is ORed in the priority detector 15 shown in FIG. 9 together with an inhibit line from each of the higher priority master devices through two 10109 or-gates AS5 and BS5 and assuming that busy and destination busy are not true and that the clock is currently not true, then R6 pin 14 (FIG. 9) will be set to a one and will set AQ5 pin 15 to a one AQ5 pin 14 to a zero and output register free not true. So the three 10109's AS5, BS5 and R6 must have all inputs at a zero in order that a transfer may take place and output register free be set not true, that is no higher priority master with an inhibit raised, a permit signal set from the wobble stat, the clock not true, busy not true and destination not true. When all these occur, output register free will be set not true and the transfer will be initiated simultaneously. A gate and B gate data signals are generated from 10211 units AM5 and BM5. These enable the data on to the bus. Any higher priority inhibit signal will stop output register free being set by this device, as will a destination busy or busy signal. The clock signal is sitting low, which means that it has completed at least half period since it set the wobble stat, i.e. since it went from a zero to a one when it set the wobble stat, and it is now back to a zero. The clock input AQ5 pin 11 is the inverse clock signal which will now be sitting at a positive level, when output register free is set. Next time it achieves the positive level, after almost a full clock period, output register free will be re-set to the new value of the data input, which is a zero since there is no connection at this point.

All the MECL gates that are used have the characteristic that where an input is left unconnected, that input assumes a zero logic level. Therefore, when the clock signal goes from zero to a one on AQ5 pin 11, pin 15 copies a zero from the data input. So this particular flip-flop is being set by AQ5 pin 12 and re-set by the clock signal and it remains set with output register not free for approximately one clock period.

Figure 14:
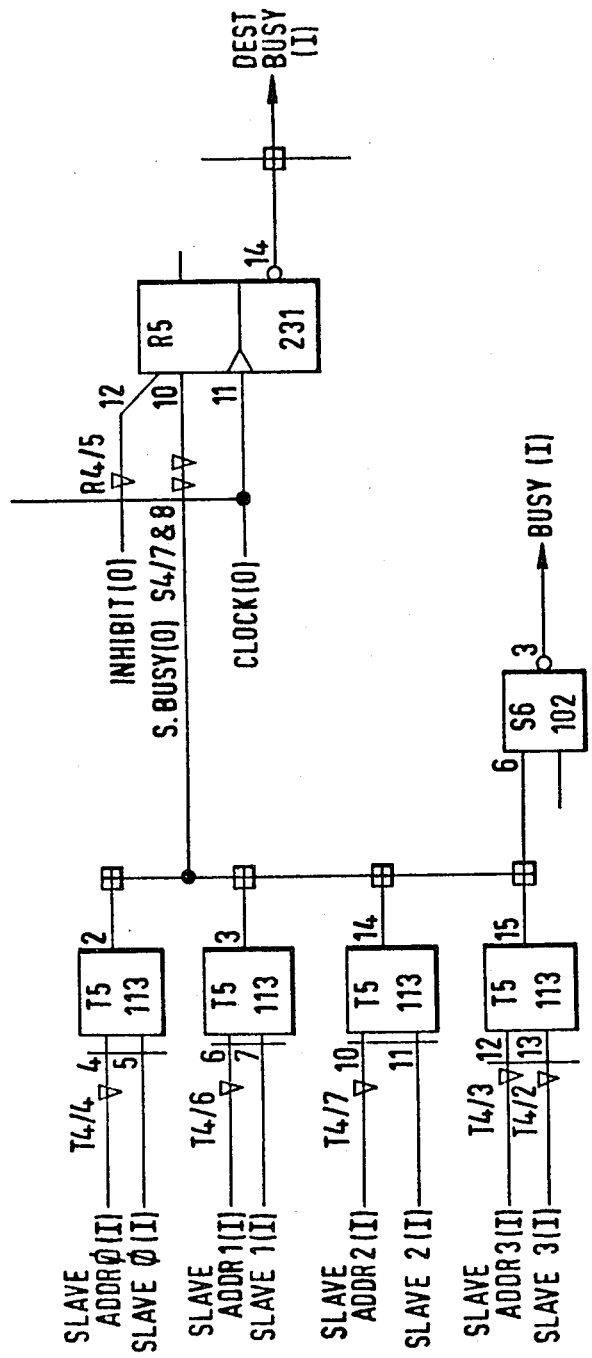

A busy signal is generated by the comparator 47 illustrated in FIG. 14 as will be described. Output register free not true is also used on the address out unit 16 of FIG. 10 to enable the slave address lines from the master on to a slave address on the bus through a series of four 10101 gates S2. When output register free is true, the outputs of S2 pins 2, 3, 14 and 15 will sit at a logic level zero, having no effect on any other addresses on the bus. The outputof all MECL 10K gates can be tie-ord together and a logic one predominates in such a situation. Therefore the logic zero outputs of gates S2 do not affect any other signals on the slave address bus. Output register free not true indicates that a transfer has started on the bus, it enables the output data register 11 to release data on to the data highway and the slave address data on to the slave address highway. It is only not true for one clock period, as described with respect to FIG. 9.

The signal output register free not being true indicates to the master device dependent logic, that a transfer is in progress and the output data register 11 should not be loaded with a new data word. A new data word can only be loaded on conclusion of the transfer indicated by output register free being true again. It is imperative that the slave address has been set up at least one clock period prior to the raising of transfer request, so that the multiplexor 18 has a chance to find out if the destination is busy.

Although only eight slave units are addressed on this particular gigabus, there are four slave address lines. The fourth slave address line shown in FIG. 10 as slave 4 (1) is used to indicate a true transfer in progress. In other words if we addressed slave port 7 (of slave ports 0 to 7), it would be the equivalent of inhibiting all the address out buffers. If we inhibited all S2 on all the masters, then we would set zeros on slave addresses zero, one and two. This would be decoded by the demand comparator in slave port 7 as a demand for a transfer, because it would see address 7 set up here, it knows its own address is 7 and therefore says a transfer is occuring. So we use a fourth bit, slave address 3, to tell it whether it is a true or a false transfer. Slave address 3 must always be not true to indicate a real transfer across the bus.

In other words, although three bits can identify eight addresses, a fourth bit is reuired to identify whether there is a real transfer.

Figure 10:
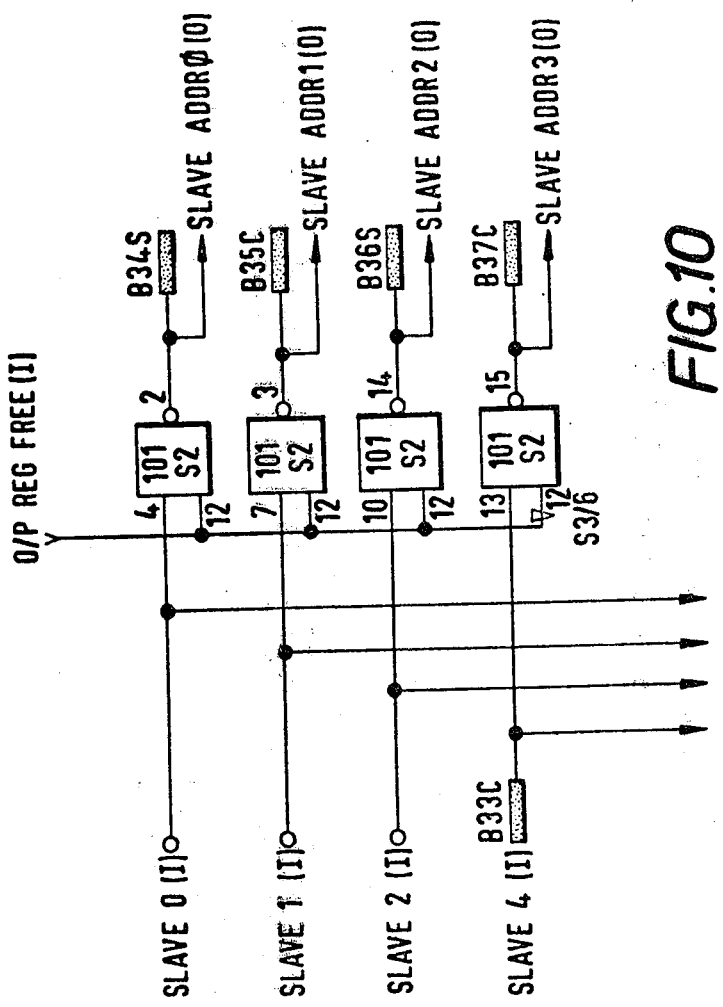

The slave address lines are transmitted down the bus on the mother board to all the slave devices from the address out unit 16 of FIG. 10. In a particular slave device, the demand comparator 47 (FIG. 11) will compare the slave address received on the bus with its own port address in the equivalent gates 10113 at position $T_2$. If an equivalence occurs, then all the outputs of $T_2$ will be zero, signal S DEM (O) is then true on pin 7 $R_5$. $R_5$ output pin 2 will be set to a zero equivalent to S DEM (0) on the next positive edge at $R_5$ pin 6. So the transfer was initiated on FIG. 9 at $Q_5$ pin 12 as clock went negative to produce a positive level at pin 12. The transfer has reached its destination as clock goes negative for a second time and pin 6 or $R_5$ on FIG. 11 goes positive to copy S DEM through to indicate input register full is true. This assumes that $R_5$ pin 2 was initially set to one. Input register full is used to inhibit further clock edges on $R_5$ pin 6 by inhibiting gate $S_6$ pin 5, which is a MECL 10K 10102. Thus no further positive clock edges can reach pin 6 until $R_5$ has been re-set by a signal Ack (1) on pin 5. Input register full is also used to inhibit a clock data and B clock data on $N_6$ which is a 10210.

This gate normally distributes clock (0) to the input data registers (FIG. 16) by inhibiting A clock data and B clock data. The data received during the relevant transfer is held in the input data register without corruption.

The acknowledge signal is used by the slave device dependent logic to indicate to the system when it is ready to receive more data at its input data register and is used to re-set input register full (IRF) and remove all the busy status lines, or to set free to the device it wishes to engage.

Figure 12:
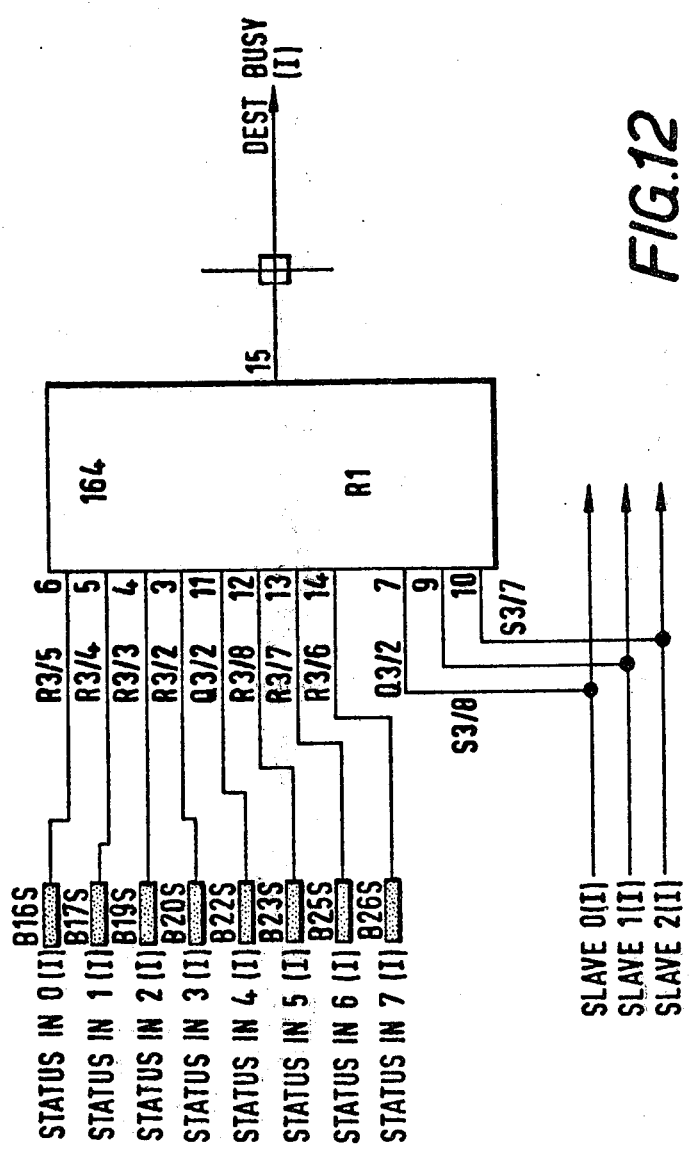

FIG. 12 shows a multiplexor which selects by three slave addresses lines one of eight status in lines and provides it as the signal destination busy. It comprises a MECL 10K 10164 gate. If the selected status in line is a zero not true and the corresponding destination busy signal is also not true, then the device is indicated free.

Figure 13:
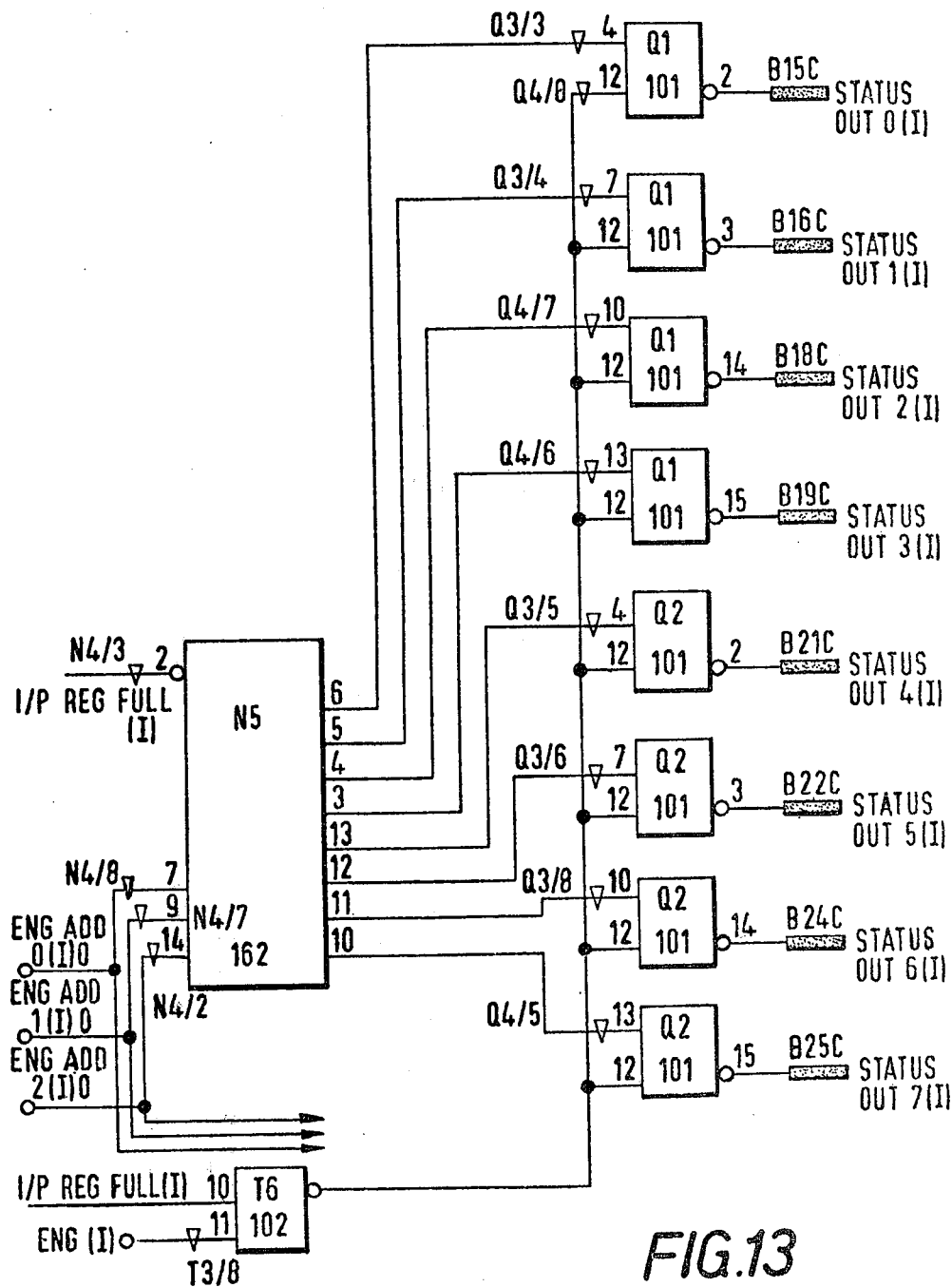

In the decoder 49 shown in FIG. 13 input register full is used this time to indicate that the slave device is busy in all its status out lines. It does this by a 10102 $T_6$ pin 10 and by (or via) $N_5$ pin 2 on a 10162 which inhibits all the output signals of $N_5$ so that every signal on $Q_1$ and $Q_2$ inputs is a zero. This produces status out true lines on status out zero to seven. If the device wishes to be engaged to one other master rather than free to all devices, when input register full is re-set by acknowledge it provides a signal engage ENG (1) on $T_6$ pin 11 and an engage address on $N_5$ pin 7, 9 and 14. This engage ENG (1) again forces a zero on to one half of all the outputs of $Q_1$ and $Q_2$, and $N_5$ now produces a one at one of its outputs which corresponds to the engaged address and so decodes a three engaged address bits into one of eight outputs and sets that output to a one. This forces one status out line to a zero, indicating free to one master only, the engaged state. $N_5$ is a 10162 which is a complex MECL 10K function providing a decode of three lines into one of eight outputs, with on pin 2 and inhibit line enabling or inhibiting all the outputs. When two transfers attempt to occur simultaneously to the same slave device it is not possible for the busy status lines to indicate busy to every master in time to stop a transfer being initiated to a busy slave. To overcome this problem the slave busy comparator 10 shown in FIG. 14 is employed. This circuit compares the slave address that a particular master wishes to address and the slave address on the slave address bus. This, when it coincides, produces a busy signal. Thus if on one clock cycle a transfer has gone to a particular slave address and a second master is also about to initiate a transfer to this same slave, the signal busy will be generated. This signal is used in the priority detector 15 of FIG. 9 to inhibit the second master from initiating a transfer. Busy is also staticised for a further clock period by $R_5$ a 10231 and the data at pin 10 thereof is clocked by pin 11 with clock going to a zero at the same time as an output register free signal would have been generated. This inhibits the second master still further and provides time for the busy status lines to indicate correctly that the slave is indeed busy. Such busy lines all de-select the master and remove the request wobble stat setting. This then has to be re-set once the slave device to which a transfer is being attempted has gone free again. The slave busy comparator 10 only provides a busy indication for between one and two clock periods as the busy and destination busy signals. As the clock continues to free run the destination busy signal will be re-set.

Figure 15:
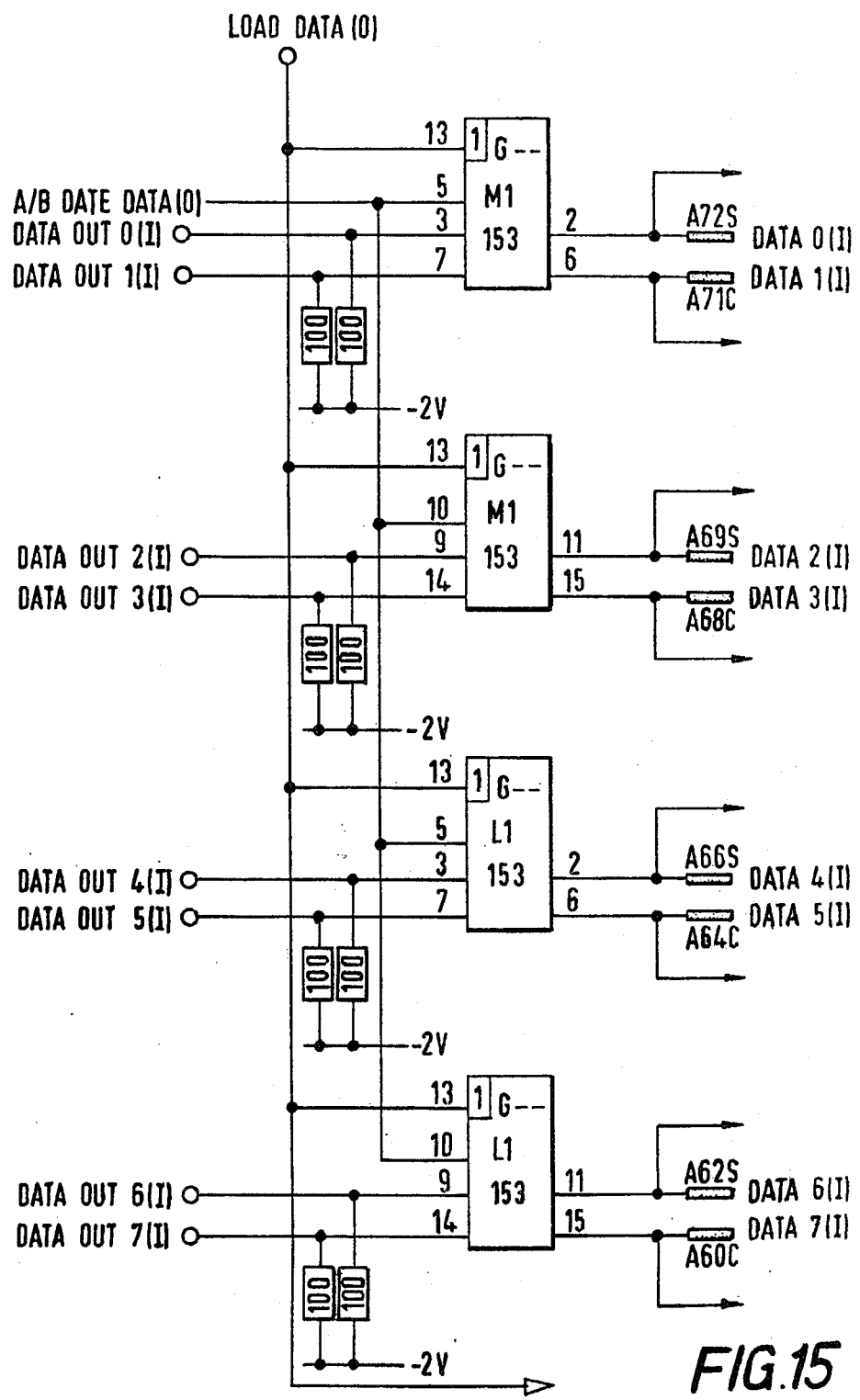

FIG. 15 shows eight bits of the output data register 11 with four 10153 MECL 10K latched buffers. The load data signal from the master device dependent logic opens and closes the latch at pin 13 allowing data out lines to be latched into the buffer. On pin 5 and 10 of the 10153 units the A and B gate data signals enable the outputs of the buffers on to the data highway for transmission to the slave device. The output data word, data out, is fed into the inputs on pins 3, 7, 9 and 14. There are four bits per 10153 pack so for 40 there would be ten packs providing the output data register. A B gate data signal enables the contents of the buffer on to the data highway for one clock period only. It does not re-set the contents of the buffer. This can only be re-set by loading a new data word in by a load data signal. The data highway on FIG. 15 is also used on FIG. 16; exactly the same data highway is used for the master output and the slave input connection. The input data register (FIG. 16) is a similar set of buffers, this time the data is latched from the data highway into the buffers using A or B, i.e., A clock data and B clock data on pin 13 of the 10153 units. The data is enabled out on to the slave's data input word by further gate data signal on pins 5 and 10. A and B clock data signals, when the device is free, are equivalent to clock (0), therefore are continually being strobed and data is continually being read off the data highway into the slave data register, i.e., into the input data register 42. When a demand comparison is detected and input register full is set, this inhibits further clock data strobes and the input data register 42 remains fixed until an acknowledge resets input register full.

Figure 17:
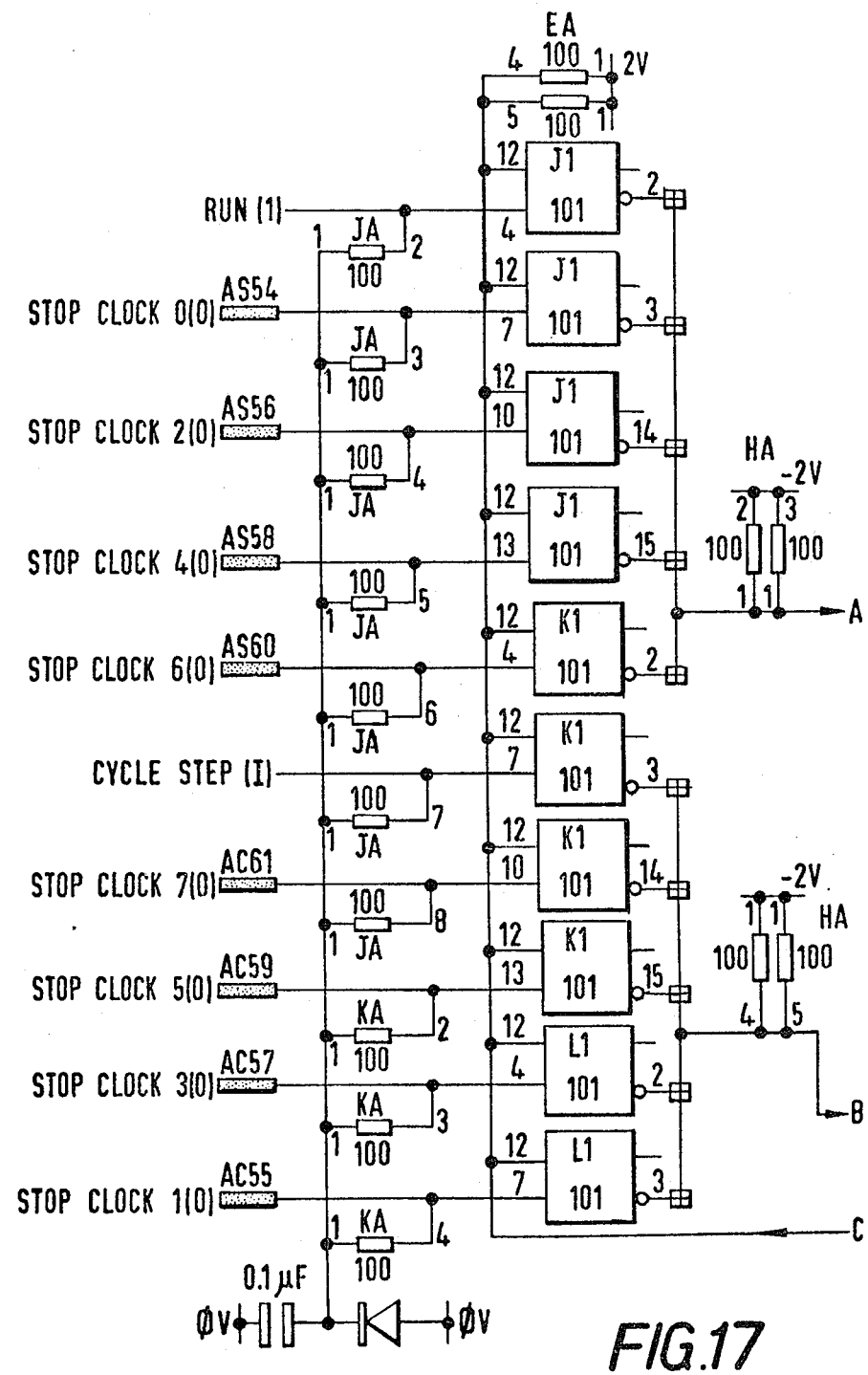

The stop clock (0) true signal is applied to gating means as illustrated in FIG. 17. As in this example eight masters are contemplated, eight gates plus two extra gates identified as J1101, K1101 and L1101 are provided and each connected to receive a separate stop clock (0) true signal. Although a single gate could be used, it is preferred to provide the number shown in order to obtain the necessary drive. The two extra gates are provided respectively to receive signals identified as RUN(1) and CYCLE STEP (1) which can be generated by a test box in order to stop or step the clock one period at a time in accordance with the depressing of a switch, but this forms no part of the instant invention. The gates are enabled to respond to the stop clock (0) true signal by signal C along line 110 which itself is generated by the clock pulse generator to be described with reference to FIG. 7. When a stop clock (0) true signal is passed by an enabled gate, the gating means generates an output signal A or B, signal A resulting from five gates having their outputs commoned and signal B resulting from the other five gates having their outputs commoned. The gates are enabled to respond to stop clock (0) true signal only when signal C on line 110 represent a (0) level in the pulse train so that the gates cannot respond whilst a clock pulse exists and is being utilised in the system, for example to pass data through the motherboard.

Figure 18:
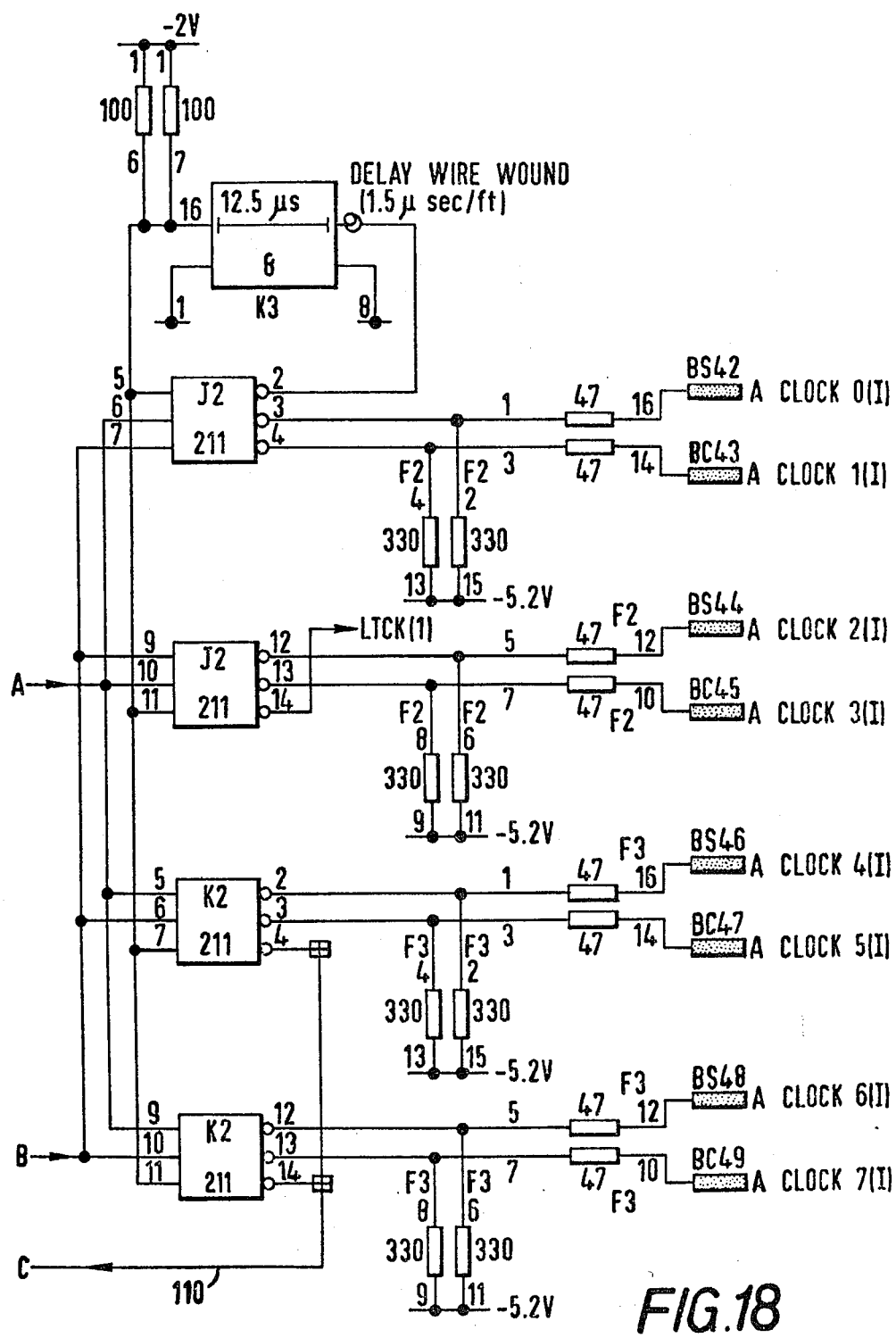

The clock source shown in FIG. 18 comprises four inverters two of which are identified as $J_2 211$ units and two as $K_2 211$ units. Each has three inputs and three outputs. The three inputs to all the inverter units may be considered to be common so that a signal level at any one input will produce its inverse level at all the outputs. Two of the outputs of each unit are used to provide pulse trains, i.e., a separate train to each of the eight masters and slaves and the third output is used for a purpose to be described. The multiplication of inverters is only to ensure sufficient power to drive the system as all the inputs may be considered common and all the outputs may be considered common. The top inverter $J_2 211$ as shown in FIG. 18 has output pin 2 connected through a delay line of 12½ nanoseconds to input pin 5. Thus if pin 2 is at level (0) input pin 5 assumes this level 12½ nano-seconds later thus changing pin 2 to level (1). 12½ nano-seconds later pin 5 assumes level (1) and pin 2 changes to level (0). Thus a clock pulse train of period 25 nano seconds is generated with a mark to space ratio of 1:1. In the event that a stop clock (0) true signal occurs, it cannot pass through the gating means of FIG. 17 until the gates are enabled by signal C along line 110 which is taken from the third output of the two inverters $K_2 211$ and is only operative when the pulse train is at (0) level and never when a pulse at level (1) is being transmitted. Thus signals A and/or B can only occur between pulses and never during pulses. Signals A and B represent level (1) and when applied to the inputs of the inverters produce outputs at level (0) to hold the clock at that value. This condition persists until the wobble stat unit Q5/231 has settled to a defined state which could in fact be right or wrong. Nevertheless, once it has settled to a defined state, pin 2 of unit Q5/231 assumes a level of (1) or (0) and pin 3 the inverse level and the stop clock (0) true signal changes to the not true level. Accordingly signals A and/or B return to the (0) level and the clock source commences to generate the pulse train. The leading edge of the first pulse samples the now stabilised level at input pin 7 of Q5/231 and identifies it correctly and the system proceeds to process the information.

By using the gate lines into pin 6 and 7 it is possible to stop and start the clock by holding it at a zero value; holding 6 or 7 at a one will force the clock to a zero. The other J2 and K2 devices are merely used to spread the load of the clock signals so that there are eight separate clock signals, each driven independently, each driven from the master clock input. Each clock signal is provided to a different master so that there are eight separate clock signals, all fully synchronised, one for each master/slave pair. Since there is only one clock, a stop clock signal from any master, once the clock has gone to a zero, will produce signal A or B, which will hold the clock at a zero until the stop clock signal is removed at which time it continues to oscillate free running. On every positive-going edge of that free running clock, the data on pin 7 of $Q_5$ in the request wobble stat of FIG. 5, is copied on to pin 2 and its inverse on to pin 3. A completely random in time signal request is generated, which is fed on to pin 7 and there is a finite chance that this signal will be changing at exactly the same time as the clock signal is going positive. In this event, the outputs on pins 2 and 3 will be undefined for a period of time while the circuit within $Q_5$(FIG. 5) settles down to whichever value it determines it should settle down to, either a one or zero. The state when it sits at bias level that is to say internally to the device both sides of the flip-flop have been set to the same level bias, results in the outputs 2 and 3 $Q_6$ also being set to bias and it takes a finite time once again for the slight imbalance in the circuits to generate sufficient impulse to switch the flip-flop one way or the other. Pins 2 and 3 will therefore settle to inverse values, either a one or a zero. In order to use that facility, a detection circuit is used which detects when the devices are sitting at bias. The detection signal is called stop clock (0) and is used to stop the clock from generating a further positive edge at pin 6 until the device has settled. Once it has settled, then the clock is freed again to generate a further positive edge and redefine pins 2 and 3 accurately, as a copy of pin 7. The output on pin 2 when it is at bias is made more negative by a resistive network to provide a more negative than bias signal on pins 4 and 9 of $AP_6$ and $BP_6$. Thus $AP_6$ which is a differential line receiver 10116 sees a more negative signal on pin 4 than on pin 5 and therefore provides a positive signal at pin 3 and a negative signal at pin 2, at full logic levels. In other words, a one on pin 3 and a zero on pin 2. Similarly, on $BP_6$ pins 6 and 7 there is a zero on pin 6 and a one on pin 7. The bias on pin 3 of $Q_5$ is made more negative on pin 12 of $CP_6$ by a resistance network. Thus we have an output on pin 15 of $CP_6$ of a one and at pin 14 of a zero. The two zeroes, one on pin 6 of $BP_6$ and one on pin 14 of $CP_6$ will generate stop clock zero, in other words stop clock true, which goes to the main clock generator and stops the clock. If either $BP_6$ pin or $CP_6$ pin 14 was a one indicating that one of the outputs of $Q_5$ was not at bias, then the clock would not stop because $Q_5$ would be about to settle into its defined state.

It will be appreciated that the invention provides means for synchronising the randomly generated transfer request signal along line 28 with the clock pulse train and avoids the error which might result if the level of the transfer request signal were changing at the time it is examined by the narrow window provided by the leading edge of a pulse in the pulse train. At the same time, the pulse is allowed to go to completion before interrupting the pulse train.

Figure 19:
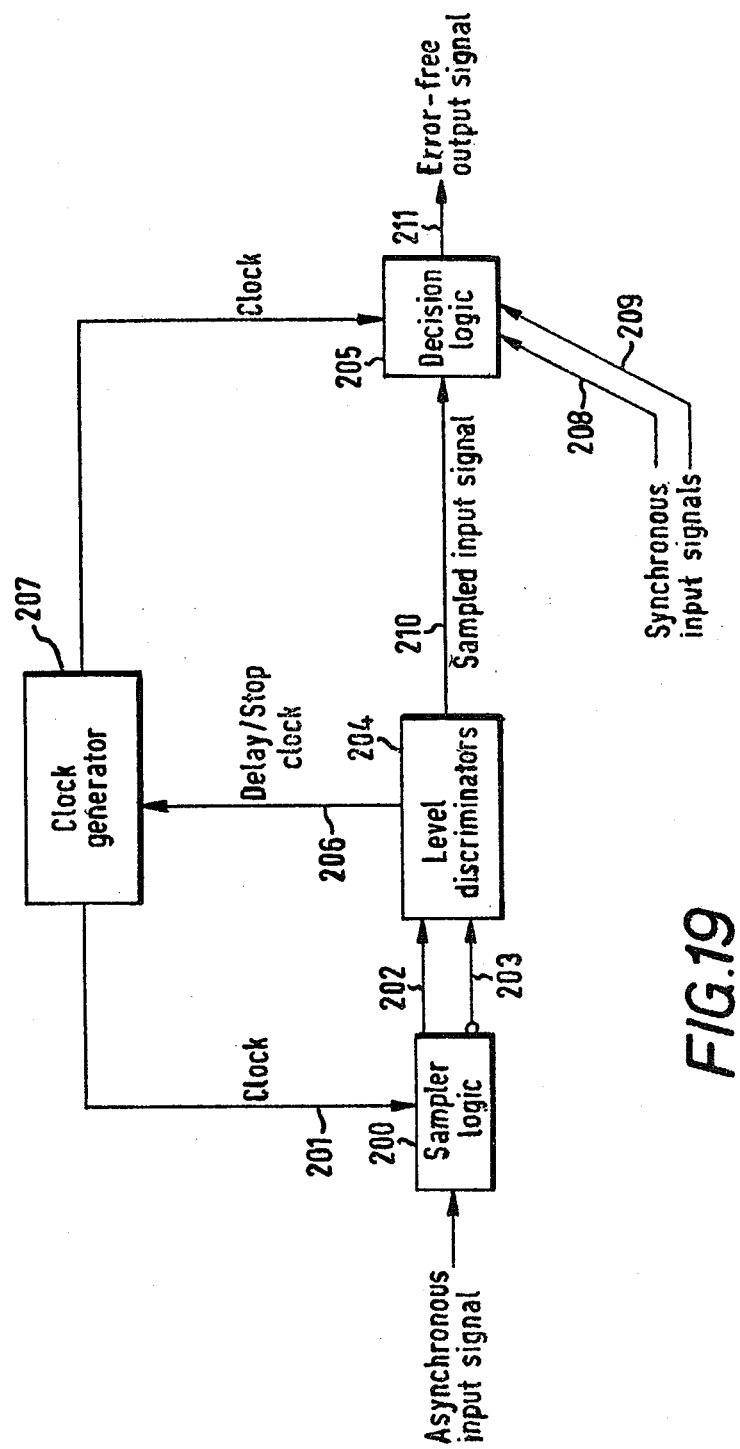
FIG. 19 is a block diagram illustrating the synchronising means of the present invention in general form.

It will be appreciated that the invention is not limited to the specific embodiment described above but has more general applications for synchronising a randomly generated signal with a periodically repeating reference signal. The more general nature of the invention is illustrated in the block diagram of FIG. 19. This shows an asynchronous input signal such as the transfer request signal of the described embodiment being supplied to a unit 200 identified as "sampler logic" which corresponds to the bistable Q5/231 of FIG. 5 and which is also supplied with the clock pulse train along line 201. The two outputs 202, 203 of the sampler unit are supplied to level discriminators 204 and if the two outputs have determined levels representing (0) and (1) respectively the level discriminators pass the sampled input signal to the unit 205 identified as "Decision logic." If However, the asynchronous input signal happens to be changing at the time the leading edge of a clock pulse is supplied to the sampler logic with the result that the levels of the two outputs thereof assume values intermediate (0) and (1), then the level discriminators detect this quiescent state and generate a signal identified as "Delay/Stop Clock" which is transmitted along line 206 and has the effect of stopping the clock generator 207 until such time as the two outputs of the sampler logic assume determined levels (0) and (1) respectively. The decision logic 205 is operated by clock pulses from the clock generator 207 and if the clock generator is stopped, so the decision logic ceases to function until the clock generator restarts, i.e. when the two outputs of the sampler logic have assumed the determined levels representing (0) and (2). The decision logic unit 205 is shown as receiving two further synchronous input signals along lines 208 and 209 from other parts of the system which together with the instruction conveyed by the sampled input signal along line 210 enable the decision logic unit 205 to decide what the next step in the system should be and produce a corresponding output signal at 211 which is synchronised with the clock pulse train and which is identified as "Error-Free Output Signal." The latter may, for example, be a signal instructing a data store to release the stored data to the data highway.

It will be appreciated that various modifications may be made to the described embodiment without departing from the scope of the invention. The information transfer device and computer system of the present invention is not limited to the specific logic circuits which are described by way of example.

What we claim is:

1. Synchronising means for synchronising with a periodically repeating reference signal the change of level of an input signal capable of assuming either one of a first and second level, comprising a source of said periodically repeating reference signal, a source of said input signal, a bistable device having first and second inputs and an output and capable of assuming a first stable state in response to the first level of input signal applied to said first input and of assuming a second stable state in response to the second level of input signal applied to said first input and enabled periodically by said reference signal applied to said second input to respond to the level of the input signal, said bistable device producing at said output an output signal having a first level representing said first stable state and a second level different from said first level and representing said second stable state, means responsive to a level of output signal intermediate said first and second levels representing an unstable condition of said bistable device, resulting from a level of input signal intermediate said first and second levels of input signal during the period the bistable device is enabled to respond, to generate a stop signal and means for applying said stop signal to said source of periodically repeating reference signal to interrupt the reference signal at a predetermined point in its periodicity and before the bistable device is next enabled, until the bistable device assumes a stable condition.

2. Synchronising means as claimed in claim 1, wherein the bistable device has two outputs each capable of assuming two levels identified as () and (1) depending on the stable state assumed by the bistable device so that the two outputs respectively assume levels (0) and (1) for the first stable state and (1) and (0) for the second stable state and each assumes an intermediate level between (0) and (1) when the bistable device is in an unstable condition.

3. Synchronising means as claimed in claim 2, wherein said means responsive to a level of output signal intermediate said first and second levels comprises comparison means operable to compare the levels of said two outputs and generate said stop signal when the difference between the levels of said two output signals is less than a predetermined value which is less than the difference between said (0) and (1) levels.

4. Synchronising means according to claim 3 wherein said means for applying said stop signal to said source of said periodically repeating reference signal includes gate means to which said stop signal is supplied and which is enabled by said reference signal at said predetermined point in its periodicity to pass said stop signal.

* * * * *